(12) United States Patent
Kitano

(10) Patent No.: US 11,044,432 B2
(45) Date of Patent: Jun. 22, 2021

(54) IMAGING ELEMENT AND ELECTRONIC DEVICE

(71) Applicant: SONY SEMICONDUCTOR SOLUTIONS CORPORATION, Kanagawa (JP)

(72) Inventor: Shin Kitano, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/466,141

(22) PCT Filed: Nov. 30, 2017

(86) PCT No.: PCT/JP2017/043158
§ 371 (c)(1),
(2) Date: Jun. 3, 2019

(87) PCT Pub. No.: WO2018/110302
PCT Pub. Date: Jun. 21, 2018

(65) Prior Publication Data
US 2020/0068155 A1 Feb. 27, 2020

(30) Foreign Application Priority Data

Dec. 13, 2016 (JP) ............................. JP2016-241353
Sep. 11, 2017 (JP) ............................. JP2017-173968

(51) Int. Cl.
*H04N 5/378* (2011.01)
*H01L 27/146* (2006.01)
*H04N 5/3745* (2011.01)

(52) U.S. Cl.
CPC ....... *H04N 5/378* (2013.01); *H01L 27/14603* (2013.01); *H01L 27/14612* (2013.01); *H01L 27/14641* (2013.01); *H01L 27/14645* (2013.01)

(58) Field of Classification Search
CPC .............. H04N 5/378; H01L 27/14603; H01L 27/14641; H01L 27/14614
See application file for complete search history.

(56) References Cited

U.S. PATENT DOCUMENTS 8,773,562 B1 * 7/2014 Fan ................... H01L 27/14643
348/308
2012/0292483 A1 11/2012 Fereyre
(Continued)

FOREIGN PATENT DOCUMENTS

WO WO 2011/161909 12/2011

OTHER PUBLICATIONS

International Search Report and Written Opinion prepared by the European Patent Office dated Feb. 5, 2018, for International Application No. PCT/JP2017/043158.

*Primary Examiner* — Ahmed A Berhan
(74) *Attorney, Agent, or Firm* — Sheridan Ross P.C.

(57) ABSTRACT

An imaging device comprises a first pixel. The first pixel includes a photoelectric conversion element to convert incident light into electric charge, and a first transfer element and a second transfer element to transfer the electric charge. The first transfer element is coupled between the photoelectric conversion element and the second transfer element. The first pixel includes a reset element coupled to the second transfer element, a floating diffusion, and an amplification element coupled to the floating diffusion to amplify a voltage of the floating diffusion. The floating diffusion is coupled between the second transfer element the amplification element.

14 Claims, 34 Drawing Sheets

(56) References Cited

U.S. PATENT DOCUMENTS

| | | | |
|---|---|---|---|
| 2013/0016263 A1* | 1/2013 | Sato | H04N 5/3658 348/302 |
| 2014/0252201 A1* | 9/2014 | Li | H04N 5/37452 250/208.1 |
| 2014/0320718 A1 | 10/2014 | Fan | |
| 2016/0043126 A1 | 2/2016 | Fan | |
| 2016/0343770 A1 | 11/2016 | Fan | |

* cited by examiner

A

B

C

A

B

C

A

B

C

A

B

C

A

B

C

A

B

A

B

IMAGING ELEMENT AND ELECTRONIC DEVICE

CROSS REFERENCE TO RELATED APPLICATIONS

This application is a national stage application under 35 U.S.C. 371 and claims the benefit of PCT Application No. PCT/JP2017/043158 having an international filing date of 30 Nov. 2017, which designated the United States, which PCT application claimed the benefit of Japanese Priority Patent Application Nos. 2016-241353 filed on 13 Dec. 2016 and 2017-173968 filed on 11 Sep. 2017, the disclosures of each of which are incorporated herein by reference.

TECHNICAL FIELD

The present technology relates to an imaging element and an electronic device, and more particularly to an imaging element and an electronic device capable of improving charge-voltage conversion sensitivity.

BACKGROUND ART

In the image sensor in the related art, there is a trade-off relationship between a charge-voltage conversion sensitivity (hereinafter also referred to as sensitivity) in a pixel and a saturated charge number, and if a floating diffusion capacity is reduced in order to improve the sensitivity, the voltage change of the battery has been increased. Therefore, the charge corresponding to exceeding the allowable voltage value that can be handled has not been read.

Meanwhile, a technology in which the charge reset switch is removed in order to increase the sensitivity has been considered (see, for example, Patent Literature 1 and Non-Patent Literature 1).

CITATION LIST

Patent Literature

PTL 1: JP 05-268526 A

Non Patent Literature

NPL 1: Min-Woong Seo, "A 0.27e-rms Read Noise 220 uV/e-Conversion Gain Reset-Gate-Less CMOS Image Sensor With 0.11um CIS Process", et. al, IEEE ELECTRON DEVICE LETTER, Vol. 36, NO. 12, Dec. 2015

SUMMARY OF INVENTION

Technical Problem

However, these methods require a very high reset voltage, which is difficult to realize in mounting.

The present technology has been proposed in view of such a situation, and it is an object thereof to be able to improve charge-voltage conversion sensitivity.

Solution to Problem

According to a first aspect of the present technology, an imaging device comprises a first pixel. The first pixel includes a photoelectric conversion element to convert incident light into electric charge; and a first transfer element and a second transfer element to transfer the electric charge. The first transfer element is coupled between the photoelectric conversion element and the second transfer element. The first pixel includes a reset element coupled to the second transfer element; a floating diffusion; and an amplification element coupled to the floating diffusion to amplify a voltage of the floating diffusion. The floating diffusion is coupled between the second transfer element the amplification element.

According to the first aspect of the present technology, the first transfer element, the second transfer element, and the reset element are transistors.

According to the first aspect of the present technology, a gate of the second transfer element includes a plurality of separated gate portions.

According to the first aspect of the present technology, a gate of the first transfer element receives a first control signal to control transfer of the electric charge to the second transfer element, and a gate of the second transfer element receives a second control signal to control transfer of electric charge received from the first transfer element to the floating diffusion and to control transfer of a reset signal to the floating diffusion.

According to the first aspect of the present technology, the imaging device includes a third transfer element between the second transfer element and the floating diffusion.

According to the first aspect of the present technology, the third transfer element is a transistor, and a gate of the third transfer element receives a third control signal to control transfer of the electric charge received from the second transfer element to the floating diffusion and to control transfer of the reset signal received from the second transfer element to the floating diffusion.

According to the first aspect of the present technology, the imaging device includes a signal line to output a pixel signal of the first pixel; and a selection element coupled between the signal line and the amplification element and to selectively output the pixel signal to the signal line according to a selection signal.

According to the first aspect of the present technology, the imaging device includes one or more second pixels. The one or more second pixels share the reset element, the second transfer element, the floating diffusion, and the amplification element with the first pixel.

According to the first aspect of the present technology, the imaging device includes a capacitance; and a third transfer element coupled between the second transfer element and the capacitance and to transfer an overflow of the electric charge at the second transfer element to the capacitance.

According to a second aspect of the present technology, an imaging device includes a first pixel. The first pixel includes a first photoelectric conversion element to convert incident light into first electric charge; a first transfer transistor to transfer the first electric charge; and a second transfer transistor. The first transfer transistor is located between the first photoelectric conversion element and the second transfer transistor in a plan view. The first pixel includes a reset transistor coupled to the second transfer transistor; and a floating diffusion to receive the first electric charge transferred from the second transfer transistor. The second transfer transistor is located between the reset transistor and the floating diffusion in the plan view.

According to the second aspect of the present technology, a gate of the first transfer transistor is adjacent to a gate of the second transfer transistor at a first position in the plan view, and a gate of the reset transistor is adjacent to the gate of the second transfer transistor at a second position in the plan view. The first pixel further comprises a third transfer transistor coupled between the second transfer transistor and the floating diffusion to transfer the first electric charge received from the second transfer transistor to the floating diffusion. A gate of the third transfer transistor is adjacent to the gate of the second transfer transistor at a third position. The third position is between the gate of the second transfer transistor and the floating diffusion.

According to the second aspect of the present technology, the first pixel further comprises an amplification transistor to amplify a signal at the floating diffusion. The floating diffusion is coupled between the second transfer transistor and the amplification transistor.

According to the second aspect of the present technology, the imaging device includes a second pixel. The second pixel includes a second photoelectric conversion element to convert incident light into second electric charge; and a third transfer transistor to transfer the second electric charge. A gate of the third transfer transistor is adjacent to the second transfer transistor at a fourth position in the plan view. The first pixel and the second pixel share at least the floating diffusion and the second transfer transistor.

According to the second aspect of the present technology, the imaging device includes a third pixel. The third pixel includes a third photoelectric conversion element to convert incident light into third electric charge; and a fourth transfer transistor to transfer the third electric charge. A gate of the fourth transfer transistor is adjacent to the gate of the second transfer transistor at a fifth position in the plan view. The imaging device includes a fourth pixel including: a fourth photoelectric conversion element to convert incident light into fourth electric charge; and a fifth transfer transistor to transfer the fourth electric charge. A gate of the fifth transfer transistor is adjacent to the gate of the second transfer transistor at a sixth position in the plan view.

According to a third aspect of the present technology, an imaging device includes at least one pixel. The at least one pixel includes a photoelectric conversion element to convert incident light into electric charge; and a first transfer element and a second transfer element to transfer the electric charge. The first transfer element is coupled between the photoelectric conversion element and the second transfer element. The at least one pixel includes a reset element coupled to the second transfer element; and a floating diffusion. The imaging device includes a driving circuit to drive the at least one pixel.

According to a fourth aspect of the present technology, an imaging device includes a first pixel. The first pixel includes a photoelectric conversion element; a first transfer element and a second transfer element. The first transfer element is coupled between the photoelectric conversion element and the second transfer element. The first pixel includes a reset element coupled to the second transfer element; a floating diffusion; and an amplification element coupled to the floating diffusion. The floating diffusion is coupled between the second transfer element and the amplification element.

In one aspect of the present technology, there is provided a node capable of performing a complete charge transfer, between a reset switch that controls resetting of a charge in a unit pixel and a floating diffusion that converts a charge into a voltage, the node being adjacent to a transfer switch that controls reading of a charge from a photodiode.

In still another aspect of the present technology, an electronic device includes an imaging unit that captures a subject; and an image processing unit that performs image processing on image data obtained by capturing performed by the imaging unit, the imaging unit including a node capable of performing a complete charge transfer, between a reset switch that controls resetting of a charge in a unit pixel and a floating diffusion that converts a charge into a voltage, the node being adjacent to a transfer switch that controls reading of a charge from a photodiode.

Advantageous Effects of Invention

According to the present technology, a captured image can be obtained. Further, according to the present technology, charge-voltage conversion sensitivity can be improved.

DESCRIPTION OF EMBODIMENTS

Figure 1:
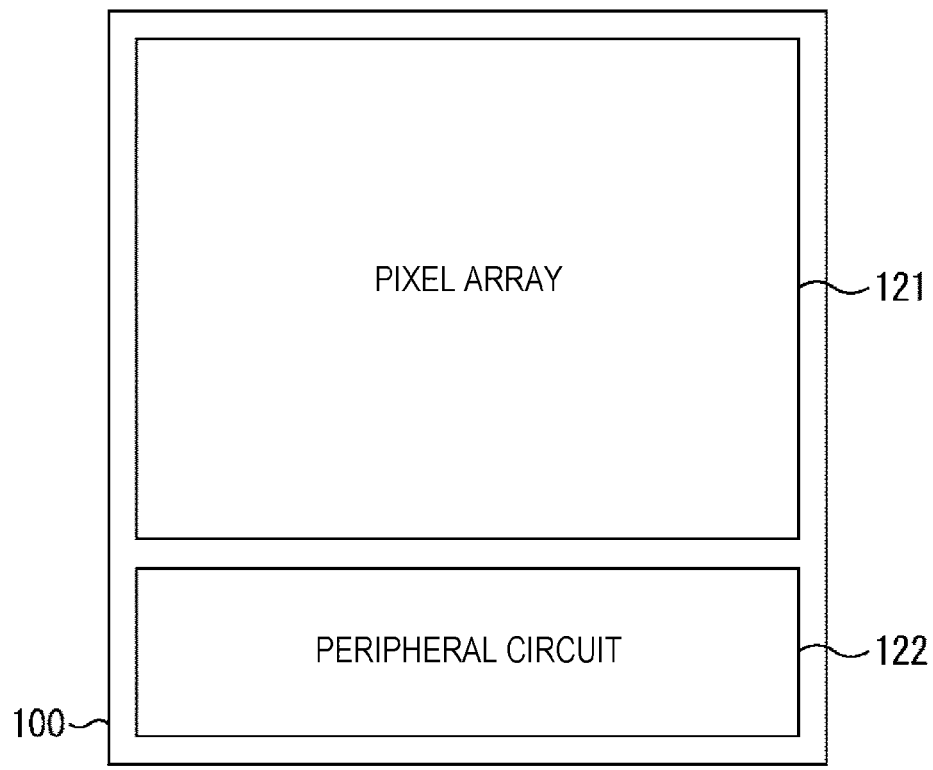
FIG. 1 is a view illustrating a main configuration example of an image sensor.

Hereinafter, a mode for carrying out the present disclosure (hereinafter referred to as embodiments) will be described. The description will be given in the following order.
1. Charge-voltage Conversion Sensitivity
2. First Embodiment (SG transistor, and FG transistor)
3. Second Embodiment (shared Pixel)
4. Third embodiment (pixel content amount)
5. Fourth Embodiment (global shutter)
6. Fifth Embodiment (SG division)
7. Sixth Embodiment (Source-grounded circuit)
8. Seventh Embodiment (SG transistor)
9. Eighth embodiment (pixel A/D)
10. Ninth Embodiment (a plurality of substrates)
11. Tenth Embodiment (imaging device)
12. Other 1. Charge-Voltage Conversion Sensitivity In the image sensor in the related art, there is a trade-off relationship between a charge-voltage conversion sensitivity (hereinafter also referred to as sensitivity) in a pixel and a saturated charge number, and if a floating diffusion (FD) capacity is reduced in order to improve the sensitivity, the voltage change of the battery is increased. Therefore, the charge corresponding to exceeding the allowable voltage value that can be handled has not been read. For example, in the case where the circuit in the subsequent stage can handle the potential amplitude of 1V, in the case of 50 uV/e-(=up to 3.2 fF), the potential amplitude has been handled up to 20000e-, but in the case of being doubled to 100 uV/e-(=up to 1.6 fF), the potential amplitude can only be handled up to 10000e-.

Incidentally, in order to increase the sensitivity, a technique in which the charge reset switch is removed as in Patent Literature 1 and Non-Patent Literature 1 has been considered.

Patent Literature 1 discloses a technique of a charge coupled device (CCD) having a mechanism for discharging a charge transferred to a floating diffusion layer region 13b by changing the electric potential of the semiconductor substrate and performing punch-through without using a reset gate or the like. In a technique in the related art, the reset gate is connected to a portion corresponding to 13b, but by eliminating the reset gate to reduce the parasitic capacitance of the floating diffusion region, it is possible to improve the sensitivity of the element. In addition, since the reset gate and the reset drain are eliminated, the wiring for the reset gate and the reset drain is also unnecessary, thereby leading to area reduction and improving integration. Furthermore, reset pulse feed through noise generated by the capacitance between the reset gate and a floating diffusion layer is eliminated, and S/N is improved.

Further, Non-Patent Literature 1 discloses a technique of resetting the floating diffusion by arranging in a pixel a node corresponding to a reset drain in the related art without arranging a reset transistor gate and by applying a voltage of 25 V to a node corresponding to the reset drain to perform punch-through. With this arrangement, the capacitance of the floating diffusion reduced, thereby achieving a high conversion gain.

However, since the reset operation of the floating diffusion is an indispensable operation for the image sensor, in these methods, extremely high reset voltage is used to extract the charge. Such a high power supply voltage cannot be used in a case of lowering the voltage or reducing the process, so that it has been difficult to realize these methods.

Even if these techniques for improving the sensitivity could be applied, if the pixel sharing technology is applied to reduce the pixel size, the FD is to be shared, which may lower the sensitivity. There is also an image sensor that can simultaneously acquire a low illuminance signal and a high illuminance signal within the same frame by switching the sensitivity, but there has been a possibility that a kTC noise may be mixed in the high illuminance signal.

2. First Embodiment

<Image Sensor>

FIG. 1 is a view illustrating a main configuration example of an image sensor which is an embodiment of an imaging element to which the present technology is applied.

The image sensor 100 illustrated in FIG. 1 is a device that photoelectrically converts light from a subject and outputs the light as image data. For example, the image sensor 100 is configured as a complementary metal oxide semiconductor (CMOS) image sensor using a CMOS, a charge coupled device (CCD) image sensor using a CCD, and the like.

As illustrated in FIG. 1, the image sensor 100 includes a pixel array region 121 which is a region where a pixel for performing photoelectric conversion is formed, and a peripheral circuit region 122 which is a region where a control circuit that controls the driving of an in-pixel circuit and a circuit that processes a signal read from the pixel array region 121 are formed.

The layout of these regions is arbitrary and is not limited to the example of FIG. 1. For example, the image sensor 100 may be formed of a plurality of semiconductor substrates, and the pixel array region 121 and the peripheral circuit region 122 may be formed on different semiconductor substrates. In that case, the layout of the plurality of semiconductor substrates is arbitrary. For example, the image sensor 100 may be formed of the plurality of semiconductor substrates to be stacked. In addition, the pixel array region 121 and the peripheral circuit region 122 may be divided into a plurality of regions, or may be formed on the plurality of semiconductor substrates.

<Pixel Array Region>

Figure 2:
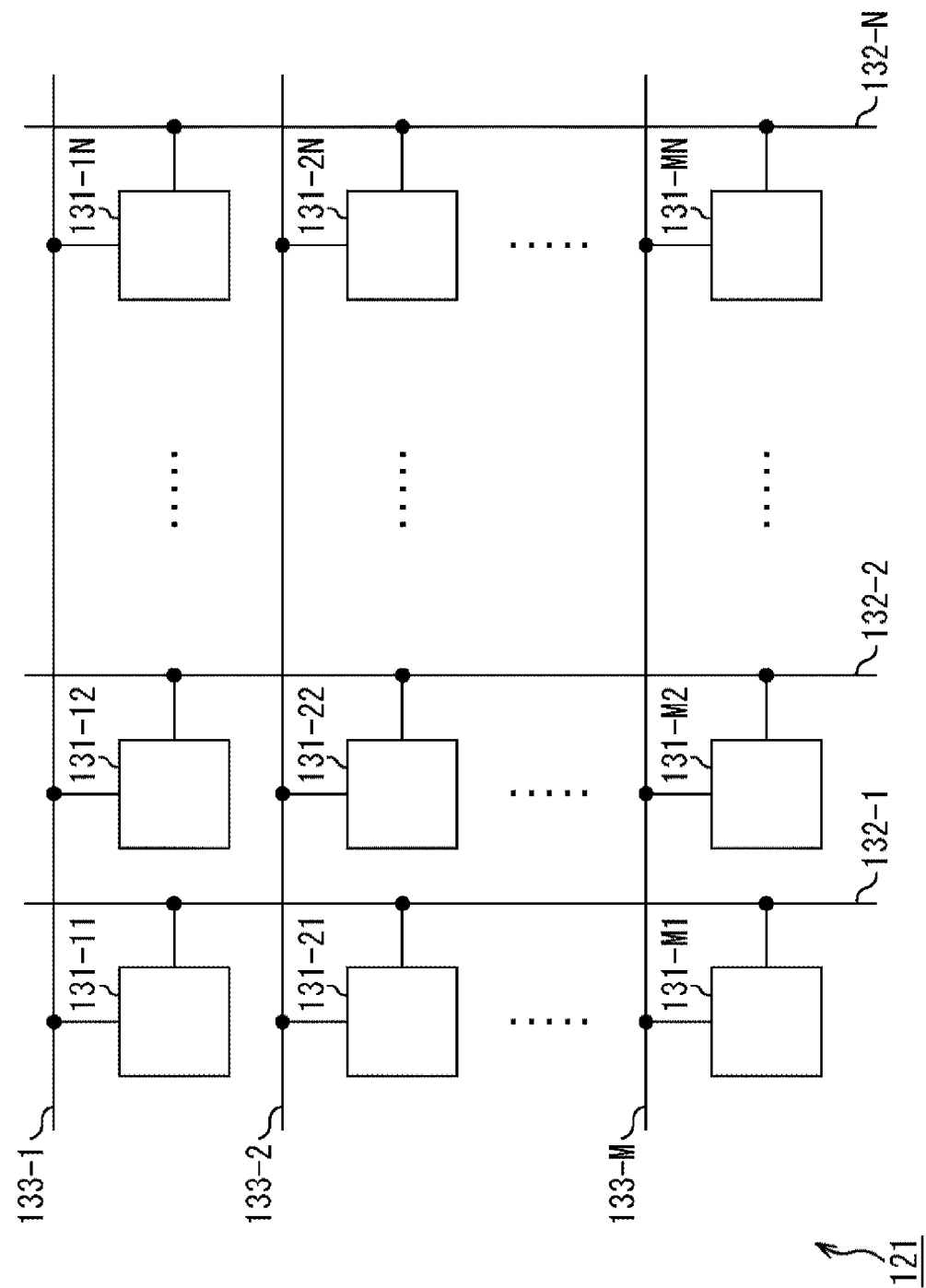
FIG. 2 is a view illustrating a main configuration example of a pixel array.

A main configuration example of the pixel array region 121 is illustrated in FIG. 2. As illustrated in FIG. 2, in the pixel array region 121, a unit pixel 131-11 to a unit pixel 131-MN are formed (M and N are arbitrary natural numbers). In a case where there is no need to distinguish the unit pixel 131-11 to the unit pixel 131-MN from each other for explanation, they are referred to as a unit pixel 131. That is, as illustrated in FIG. 2, in the pixel array region 121, M rows and N columns of the unit pixels 131 are arranged in a matrix (array).

Further, as illustrated in FIG. 2, in the pixel array region 121, a vertical signal line 132-1 to a vertical signal line 132-N and a control line 133-1 to a control line 133-M are formed. In a case where there is no need to distinguish the vertical signal line 132-1 to the vertical signal line 132-N from each other, they are referred to as a vertical signal line 132, and in a case where there is no need to distinguish the control line 133-1 to the control line 133-M from each other, they are referred to as a control line 133.

For each column, the vertical signal line 132 corresponding to that column is connected to the unit pixel 131 and is connected to the control line 133 corresponding to that row for each row. A control signal to each unit pixel (each row) 131 is transmitted via each control line 133.

A signal read from the unit pixel 131 in accordance with the control signal supplied via the control line 133 is transmitted to a circuit (for example, an A/D converter or the like) of the peripheral circuit region 122 via the vertical signal line 132. In FIG. 2, the control line 133 of each row is illustrated as a single line, but actually, the control line 133 is constituted by a plurality of control lines for various transistors in the unit pixel 131.

In FIG. 2, it is described that signal lines (vertical signal line 132) for transmitting pixel signals are provided for each column and control lines 133 are provided for each row. However, arrangement of unit pixels 131, signal lines (vertical signal line 132), and control lines 133 is arbitrary, and is not limited to the example of FIG. 2. For example, the unit pixel 131 may be arranged so as to form a honeycomb structure. Further, for example, the signal lines may be provided for each row, or may be provided for each region (arbitrary partial region) of the pixel array region 121, or may be provided for each unit pixel 131. Further, for example, the control lines 133 may be provided for each column, or may be provided for each region (arbitrary partial region) of the pixel array region 121, or may be provided for each unit pixel 131.

<Unit Pixel Configuration>

Figure 3:
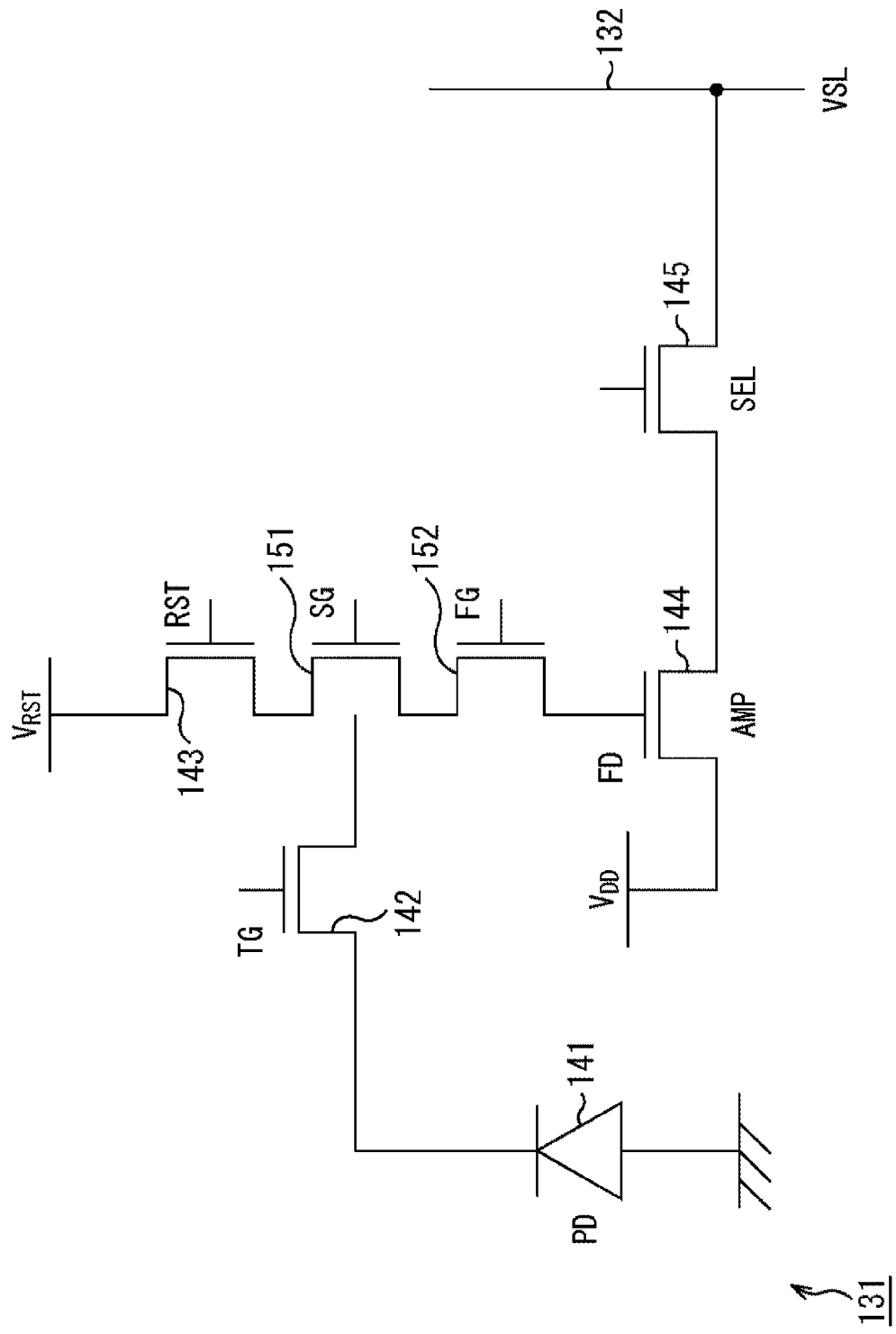
FIG. 3 is a circuit diagram illustrating a main configuration example of a unit pixel.

A main configuration example of the circuit of the unit pixel 131 is illustrated in FIG. 3. As illustrated in FIG. 3, the unit pixel 131 includes a photodiode 141 (PD), a transfer transistor 142 (TG), a reset transistor 143 (RST), an amplification transistor 144 (AMP), and a selection transistor 145 (SEL). The unit pixel 131 also has an SG 151 and an FG 152.

The photodiode 141 photoelectrically converts the received light into a photocharge (here, photoelectron) having a charge amount corresponding to the light amount, and accumulates the photocharge. The anode of the photodiode 141 is connected to the ground of the pixel region (grounded), and the cathode is connected to the floating diffusion (FD) via the transfer transistor 142. Needless to say, a system in which the cathode of the photodiode 141 is connected to the power supply (pixel power supply) of the pixel region, the anode is connected to the floating diffusion (FD) via the transfer transistor 142, and the photoelectric charge is read as an optical hole may be used.

The transfer transistor 142 controls reading of the photoelectric charge from the photodiode 141. The drain of the transfer transistor 142 is connected to the SG 151, and the source is connected to the cathode of the photodiode 141. Further, a transfer control signal is supplied to the gate of the transfer transistor 142. The reading of photoelectric charge from the photodiode 141 is controlled by this transfer control signal. For example, in a case where the transfer control signal (that is, the gate potential of the transfer transistor 142) is in an off state, no photocharge is transferred from the photodiode 141, and in an on state, the photocharge accumulated in the photodiode 141 is transferred to the floating diffusion. That is, the transfer transistor 142 functions as a switch. Therefore, the transfer transistor 142 is also referred to as a transfer switch.

The reset transistor 143 resets a charge (for example, a charge of a photodiode 141 or a floating diffusion) in the unit pixel. The drain of the reset transistor 143 is connected to a power supply potential ($V_{RST}$), and the source is connected to the SG 151. In addition, a reset control signal is supplied to the gate of the reset transistor 143. The resetting of the charge in the unit pixel is controlled by this reset control signal. For example, in a case where the reset control signal (that is, the gate potential of the reset transistor 143) is in the off state, resetting is not performed, and in the on state, the charge in the unit pixel is reset.

The amplification transistor 144 amplifies the potential change of the floating diffusion and outputs the resultant as an electric signal (analog signal). That is, the amplification transistor 144 functions as a reading circuit that reads the voltage of the floating diffusion. The amplification transistor 144 has a configuration of a source follower (drain grounded). The amplification transistor 144 has a gate connected to the floating diffusion (FG 152), a drain connected to a source follower power supply voltage ($V_{DD}$), and a source connected to the drain of the selection transistor 145. For example, the amplification transistor 144 outputs a reset signal (reset level) corresponding to the potential of the floating diffusion in the reset state to the selection transistor 145. In addition, the amplification transistor 144 outputs to the selection transistor 145 a light accumulation signal (signal level) corresponding to the potential of the floating diffusion in a state where the photocharge is transferred from the photodiode 141.

The selection transistor 145 controls the output of the electric signal supplied from the amplification transistor 144 to the vertical signal line 132 (VSL). The drain of the selection transistor 145 has a drain connected to the source of the amplification transistor 144, and a source connected to the vertical signal line 132. In addition, a selection control signal is supplied to the gate of the selection transistor 145. The output of the electric signal supplied from the amplification transistor 144 to the vertical signal line 132 (VSL) is controlled by this selection control signal. For example, in a case where the selection control signal (that is, the gate potential of the selection transistor 145) is in the off state, a reset signal, a pixel signal, or the like is not output from the unit pixel 131 to the vertical signal line 132. On the other hand, in a case where the selection control signal is in the on state, a signal (reset signal, pixel signal, or the like) output from the amplification transistor 144 is output to the vertical signal line 132 (the reset signal, the pixel signal, or the like is read from the unit pixel 131).

The SG 151 is a node capable of performing a complete charge transfer, the node being provided between the reset transistor 143 and the floating diffusion. That is, the SG 151 is a node capable of complete depletion. The SG 151 is adjacent to the transfer transistor 142. Further, the SG 151 is connected to the transfer transistor 142, the reset transistor 143, and the FG 152. The SG 151 can apply a reset voltage $V_{RST}$ to the floating diffusion and transfer all charges of the SG 151 to the floating diffusion or reset transistor 143. Further, the SG control signal is supplied to the gate of the SG 151. The potential can be controlled by this SG control signal, whereby application of the reset voltage $V_{RST}$ and complete depletion can be realized. That is, for example, in a case where the SG control signal (that is, the gate potential of the SG 151) is in the on state, the reset voltage $V_{RST}$ can be propagated to the floating diffusion. In addition, the charge supplied from the photodiode 141 via the transfer transistor 142 can be completely transferred to the floating diffusion.

The FG 152 is a node that separates the SG 151 and the floating diffusion. The FG 152 may have a structure capable of performing a complete charge transfer similar to SG 151. The FG 152 is connected to the SG 151 and the amplification transistor 144 (floating diffusion). An FG control signal is supplied to the gate of the FG 152. This FG control signal controls transfer of a charge from the SG to the floating diffusion. For example, in a case where the FG control signal (that is, the gate potential of the FG 152) is in the off state, the charge is not transferred from the SG 151 to the floating diffusion. On the other hand, in a case where the FG control signal is in the on state, it is possible to transfer the charge from the SG 151 to the floating diffusion.

The floating diffusion (FD) is a node for converting the charge into a voltage, and is a floating diffusion layer formed between the FG 152 and the amplification transistor 144. The capacitance of the floating diffusion is a junction capacitance of a diffusion layer of the transfer transistor 142, an overlap capacitance of the gate on the diffusion layer, and a parasitic capacitance of the wiring connected to the diffusion layer and a source follower amplifier. As the capacity decreases, "sensitivity improves" because a potential change per charge increases from the equation of the physical capacity of $Q=CV$. However, there has been a problem that since the voltage range that can be used in the circuit of the subsequent stage is determined, a trade-off relationship that the number of charges that can be handled decreases if the sensitivity improves too much.

Figure 4:
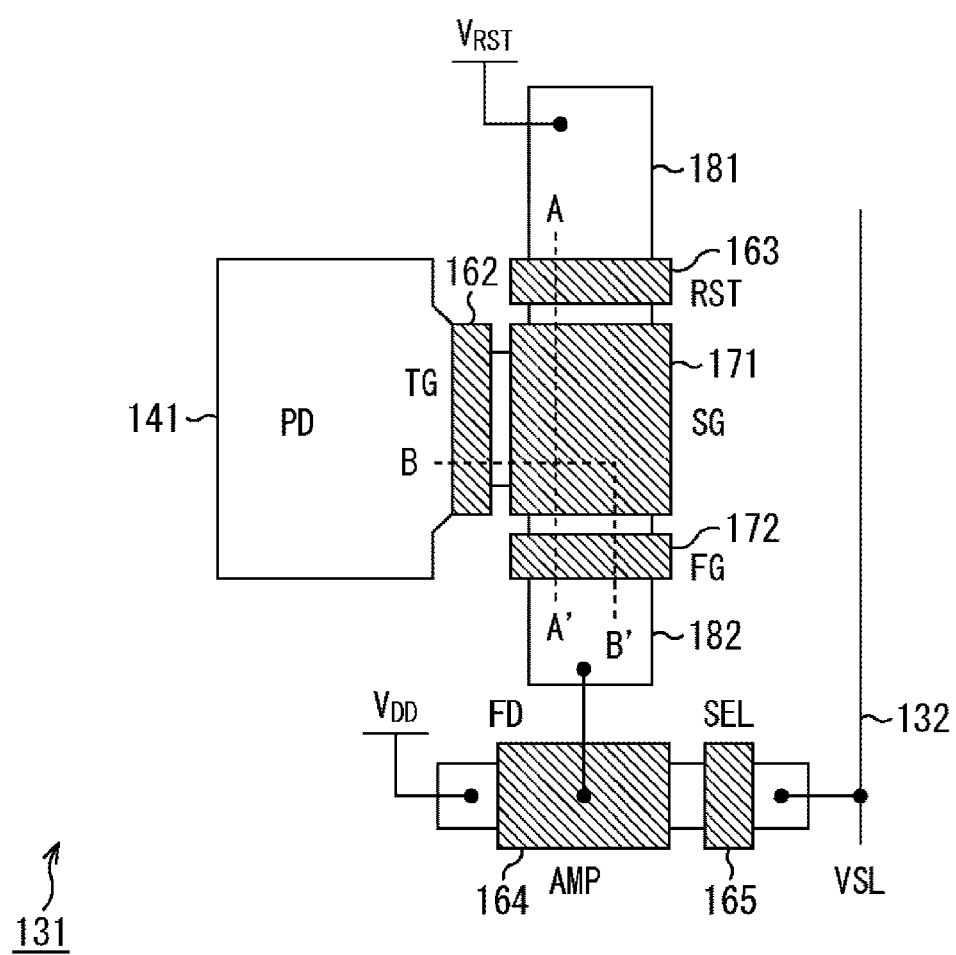
FIG. 4 is a plan view illustrating a main configuration example of the unit pixel.

FIG. 4 is a plan view illustrating a main configuration example of the unit pixel 131. As illustrated in FIG. 4, a gate 162 of the transfer transistor 142, a gate 163 of the reset transistor 143, a gate 164 of the amplification transistor 144, a gate 165 of the selection transistor 145, a gate 171 of SG 151, and a gate 172 of the FG 152 are arranged.

Figure 5:
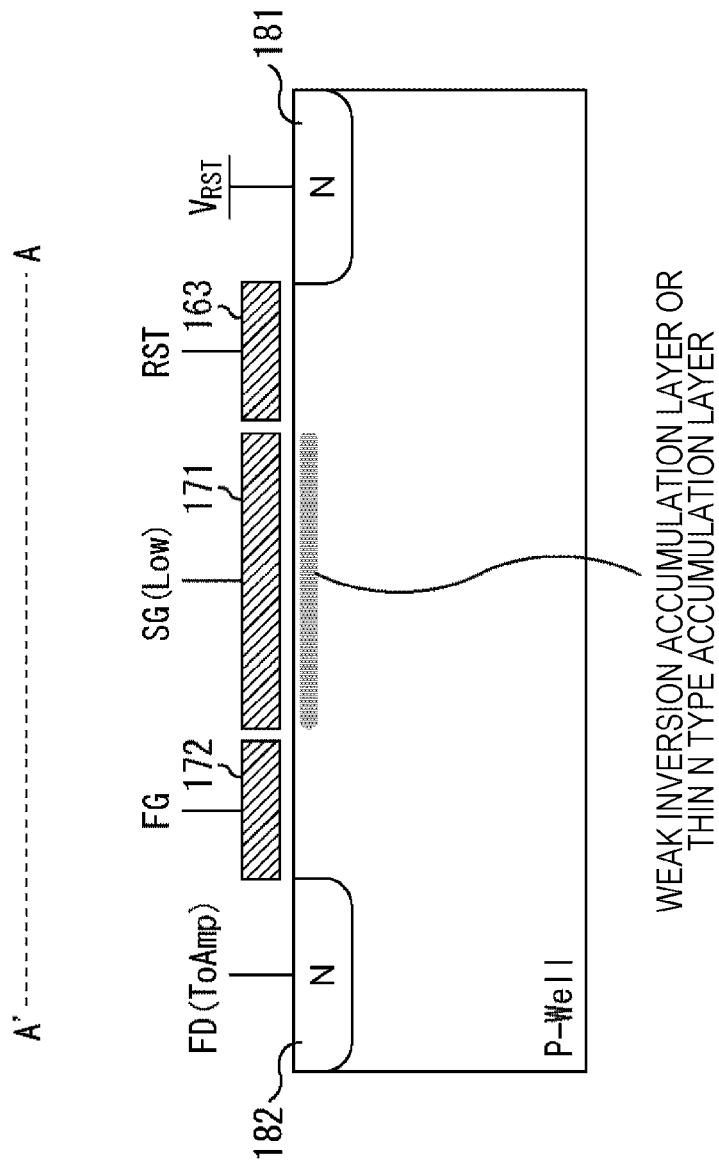
FIG. 5 is a cross-sectional view illustrating a main configuration example of the unit pixel 131.

FIG. 5 is a cross-sectional view illustrating a main configuration example of the unit pixel 131. FIG. 5 illustrates a cross section taken along a dotted line of a section between A and A' in FIG. 4. As illustrated in FIG. 5, the gate 163 of the reset transistor 143, the gate 171 of the SG 151, and the gate 172 of the FG 152 are arranged side by side between the drain 181 of the reset transistor 143 and the floating diffusion 182. A weak inversion accumulation layer or a thin N type accumulation layer is formed in a P-Well on the lower side of the SG 151 in FIG. 5.

As described above, the transfer transistor 142 (gate 162) and the SG 151 (gate 171) are adjacent to each other and are connected to each other. Further, the reset transistor 143 (gate 163) and the floating diffusion 182 (FD) are separated by SG 151 (gate 171) and FG 152 (gate 172). With such a configuration, the parasitic capacitance on the floating diffusion can be reduced. With this arrangement, charge-voltage conversion sensitivity can be improved.

Further, by separating the SG 151 and the floating diffusion 182 by the FG 152, it is possible to more easily control the charge transfer of the SG 151.

<State of Driving>

Next, an example of how the circuit in the unit pixel 131 is driven (state of charge transfer) will be described with reference to FIGS. 6 to 15.

Figure 6:
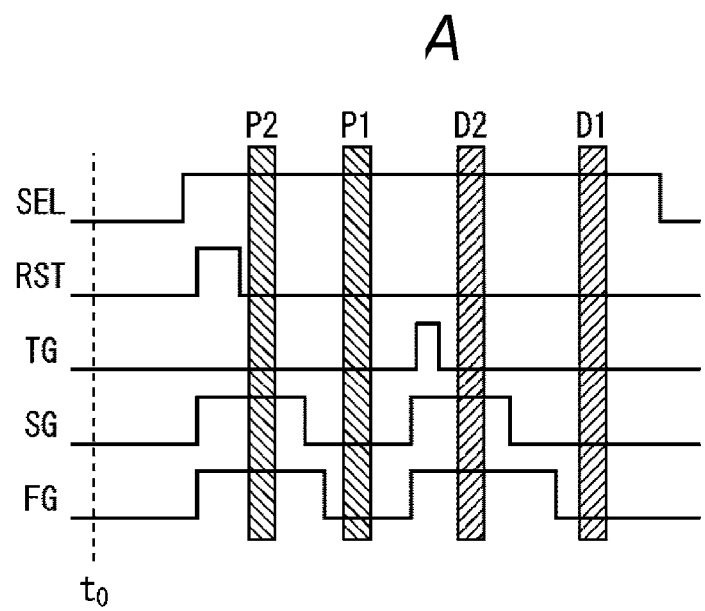
FIG. 6 is a view for explaining an example of a driving state.
Figure 6:
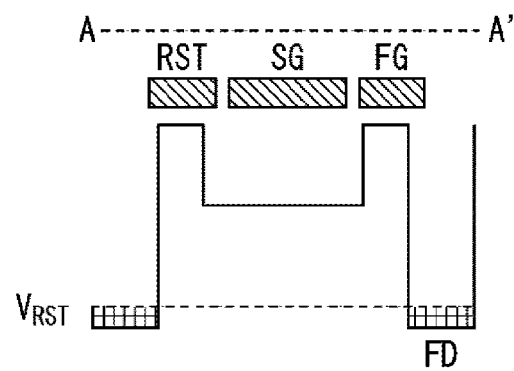
Figure 6:
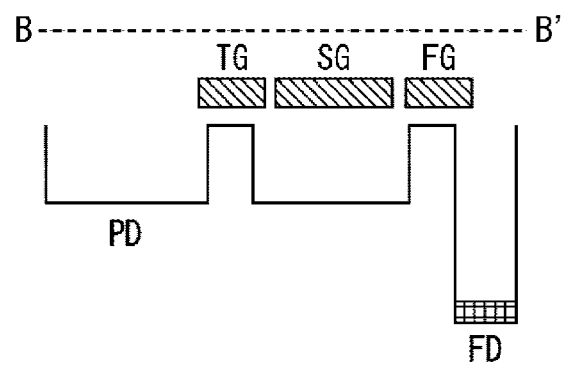
Figure 7:
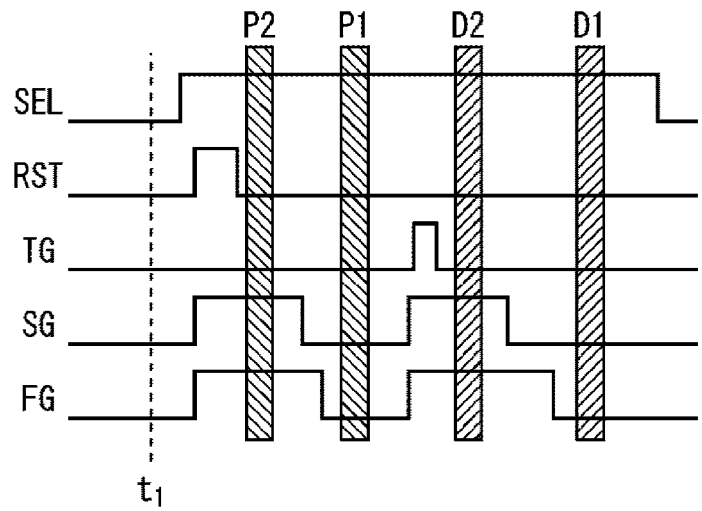
FIG. 7 is a view for explaining an example of a driving state.
Figure 7:
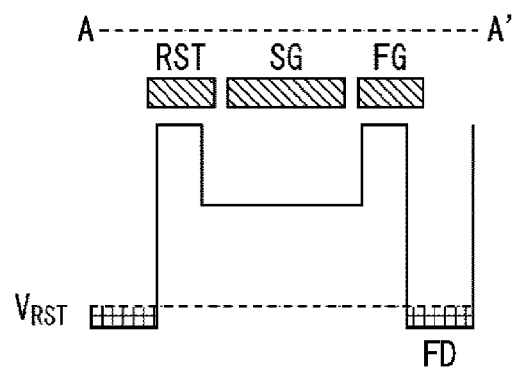
Figure 7:
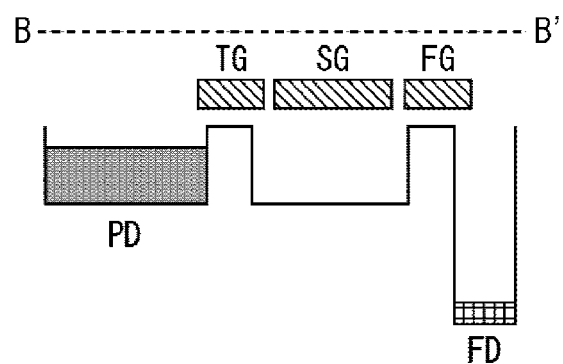

A of FIG. 6 is a timing chart of the selection control signal (SEL), the reset control signal (RST), the transfer control signal (TG), the SG control signal (SG), and the FG control signal (FG). At the time $t_0$ illustrated in A of FIG. 6, a potential distribution of the section between A and A' in FIG. 4 is as illustrated in B of FIG. 6, and a potential distribution between B and B' in FIG. 4 is as illustrated in C of FIG. 6. When the time elapses and a time $t_1$ in A of FIG. 7 has come, the potential distribution of the section between A and A' in FIG. 4 is as illustrated in B of FIG. 7, and the potential distribution between B and B' in FIG. 4 is as illustrated in C of FIG. 7. As illustrated in C of FIG. 7, the charge is accumulated in the photodiode 141 by photoelectric conversion.

Figure 8:
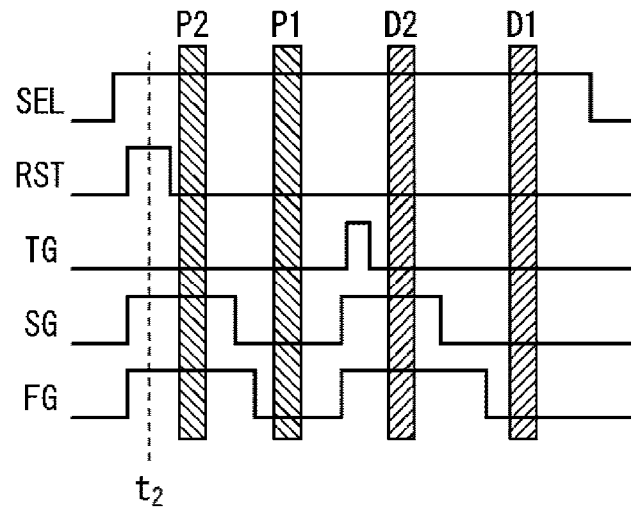
FIG. 8 is a view for explaining an example of a driving state.
Figure 8:
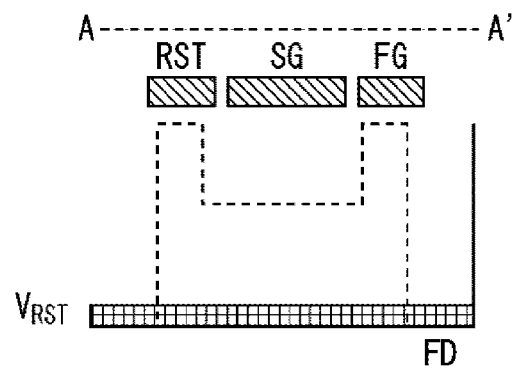
Figure 8:
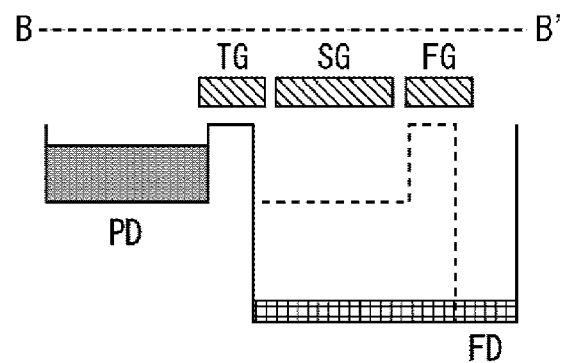

At a time $t_2$ in A of FIG. 8, the selection transistor 145, the SG 151, and the FG 152 are turned on, the reset transistor 143 is also turned on, and the charge of the floating diffusion 182 is reset. At the time, the potential distribution of the section between A and A' in FIG. 4 is as illustrated in B of FIG. 8, and the potential distribution between B and B' in FIG. 4 is as illustrated in C of FIG. 8.

Figure 9:
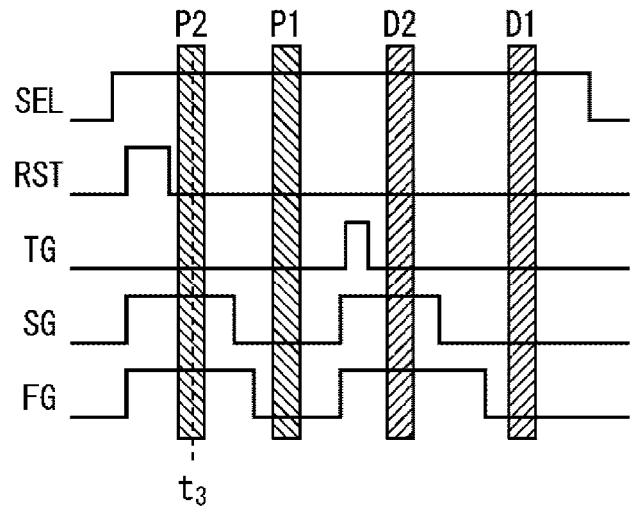
FIG. 9 is a view for explaining an example of a driving state.
Figure 9:
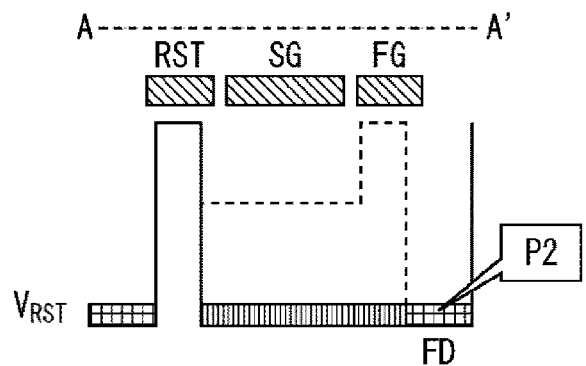
Figure 9:
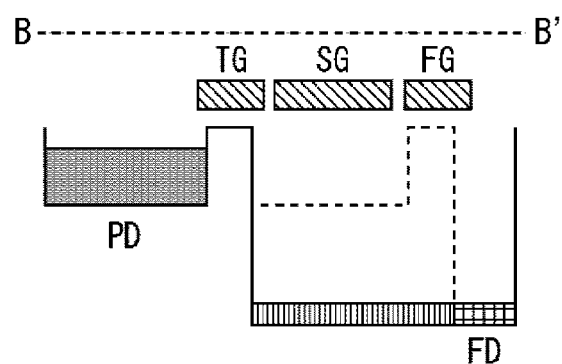

At a time $t_3$ in A of FIG. 9, the reset transistor 143 is turned off, and a first P phase reading is performed. At the time, the potential distribution of the section between A and A' in FIG. 4 is as illustrated in B of FIG. 9, and the potential distribution between B and B' in FIG. 4 is as illustrated in C of FIG. 9. The SG 151 and the FG 152 are in the on state. Therefore, this is a state in which the SG 151 and the floating diffusion 182 are connected. That is, as illustrated in B of FIG. 9 and C of FIG. 9, the potential of the SG 151 is equal to that of the floating diffusion 182. Therefore, the P phase reading is performed in a low sensitivity state, and a reset signal for high illuminance is obtained from the unit pixel 131 (P2).

Figure 10:
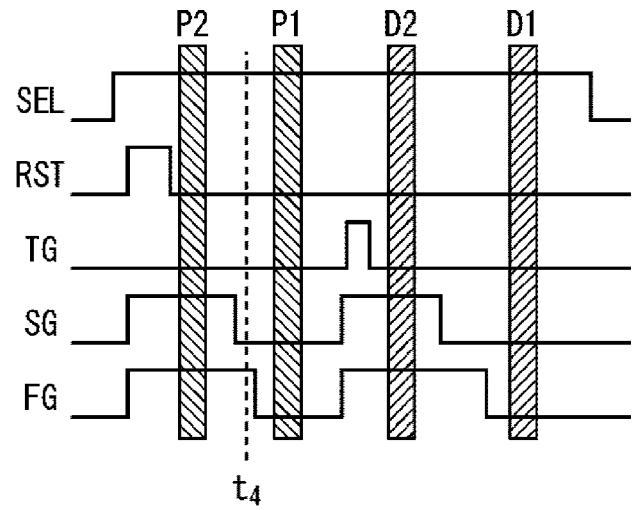
FIG. 10 is a view for explaining an example of a driving state.
Figure 10:
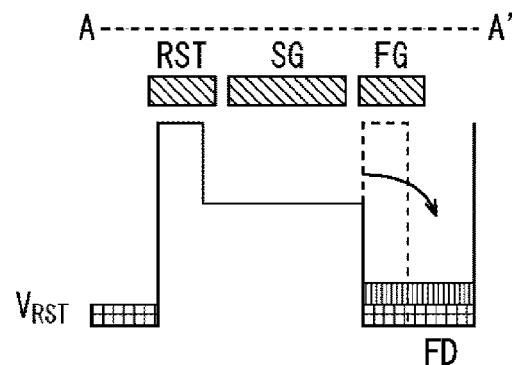
Figure 10:
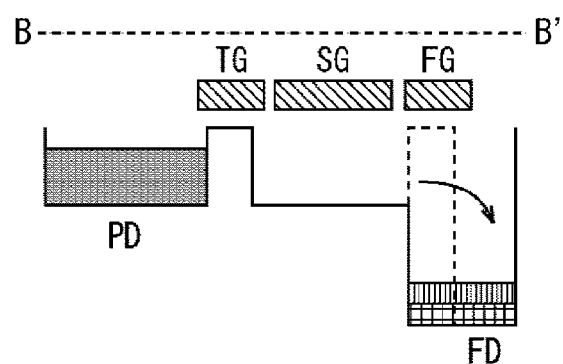

At a time $t_4$ in A of FIG. 10, the SG 151 is turned off. At the time, the potential distribution of the section between A and A' in FIG. 4 is as illustrated in B of FIG. 10, and the potential distribution between B and B' in FIG. 4 is as illustrated in C of FIG. 10. At this time, since the potential of the SG 151 is higher than that of the floating diffusion 182 and the FG 152 is in the on state, the charge is completely transferred from the SG 151 to the floating diffusion 182.

Figure 11:
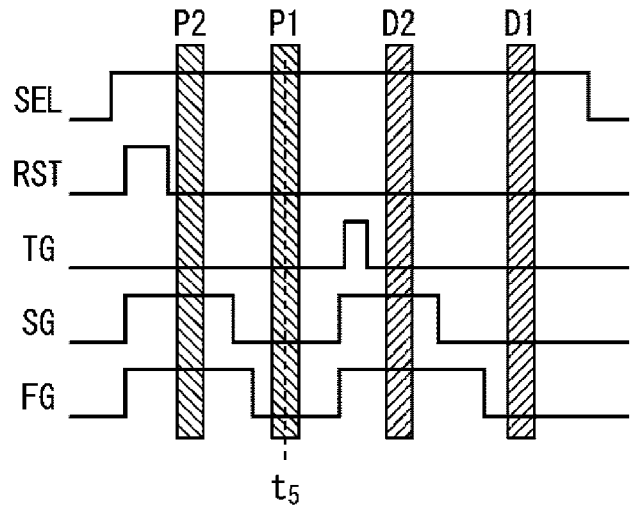
FIG. 11 is a view for explaining an example of a driving state.
Figure 11:
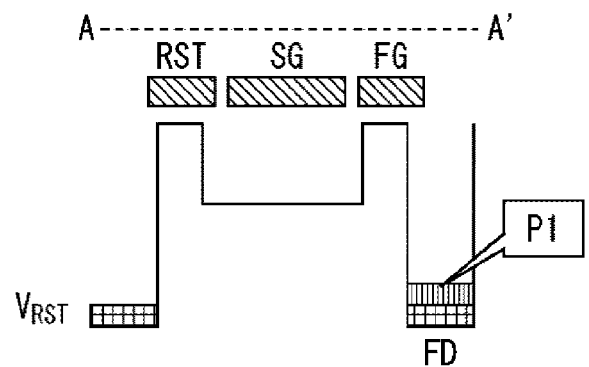
Figure 11:
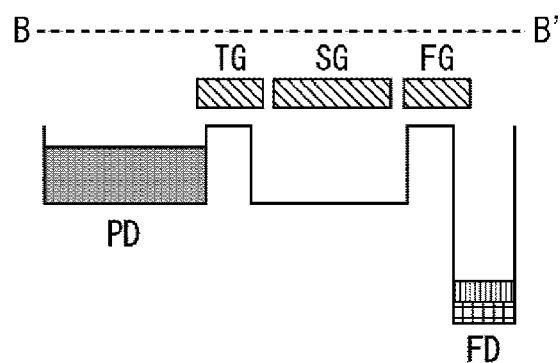

At a time $t_5$ in A of FIG. 11, the FG 152 is turned off, and a second P phase reading is performed. At the time, the potential distribution of the section between A and A' in FIG. 4 is as illustrated in B of FIG. 11, and the potential distribution between B and B' in FIG. 4 is as illustrated in C of FIG. 11. The SG 151 and the FG 152 are in the off state. Therefore, this is a state in which the SG 151 and the floating diffusion 182 are separated. Therefore, in this case, only the charge of the floating diffusion 182 is read. At this time, as described with reference to FIG. 10, the charge completely transferred from the SG 151 is also accumulated in the floating diffusion 182, and this charge is also read. That is, the P phase reading is performed in a high sensitivity state, and a reset signal for low illuminance is obtained from the unit pixel 131 (P1).

Figure 12:
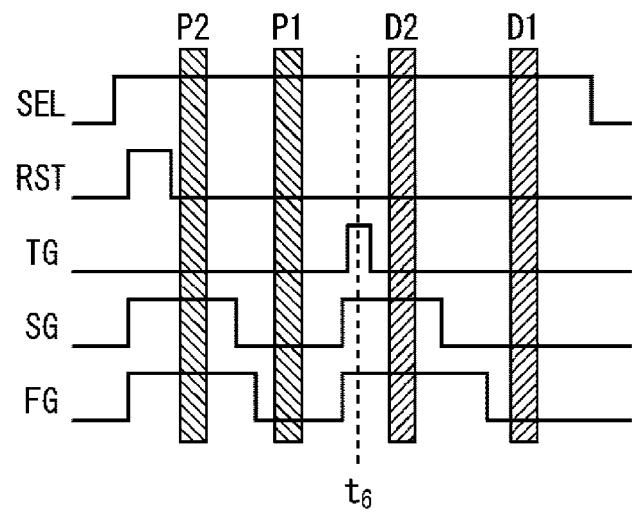
FIG. 12 is a view for explaining an example of a driving state.
Figure 12:
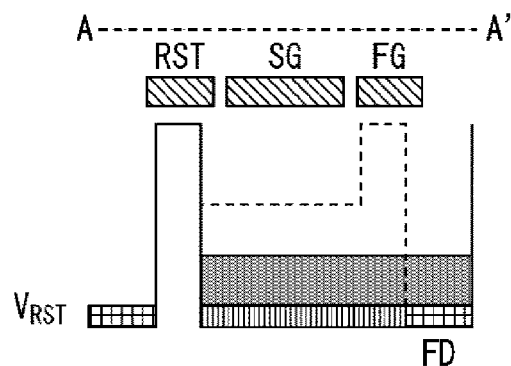
Figure 12:
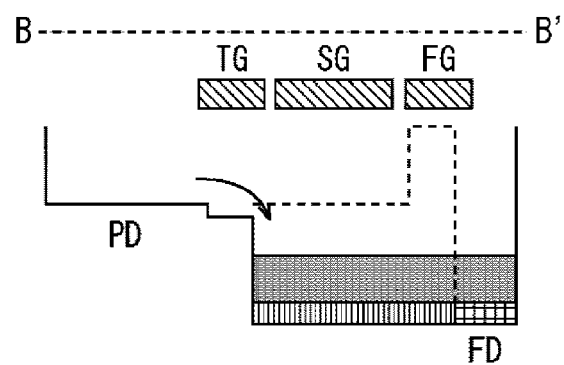

At a time $t_6$ in A of FIG. 12, the transfer transistor 142 is turned on, and the charge of the photodiode 141 is transferred. At the time, the SG 151 and the FG 152 are also in the on state, the potential distribution of the section between A and A' in FIG. 4 is as illustrated in B of FIG. 12, and the potential distribution between B and B' in FIG. 4 is as illustrated in C of FIG. 12. In other words, since the potential of the SG 151 is identical to that of the floating diffusion 182 as in the case of FIG. 9, the charge of the photodiode 141 is transferred to the SG 151 and the floating diffusion 182, as illustrated in C of FIG. 12.

Figure 13:
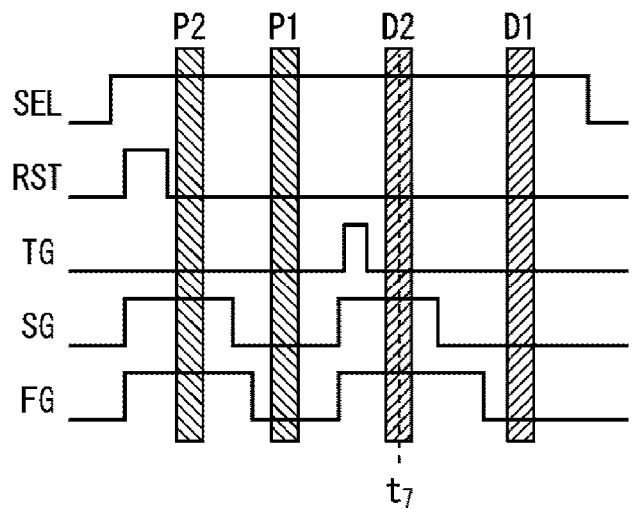
FIG. 13 is a view for explaining an example of a driving state.
Figure 13:
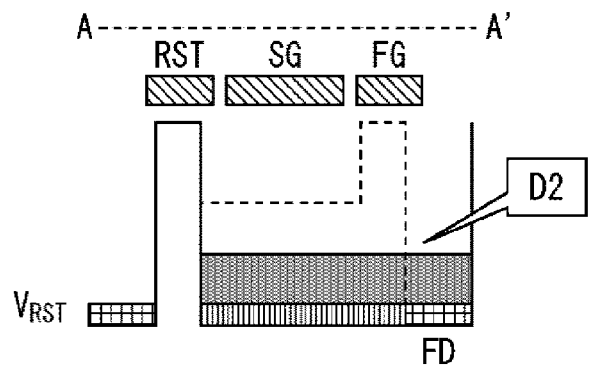
Figure 13:
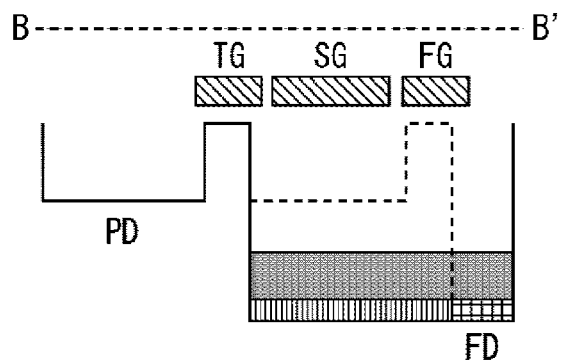

At a time $t_7$ in A of FIG. 13, the transfer transistor 142 is turned off, and a first D phase reading is performed. At the time, the potential distribution of the section between A and A' in FIG. 4 is as illustrated in B of FIG. 13, and the potential distribution between B and B' in FIG. 4 is as illustrated in C of FIG. 13. As in FIG. 12, since the SG 151 and the FG 152 are in the on state, the SG 151 and the floating diffusion 182 are connected and the potentials are the same. Therefore, D phase reading is performed in a low sensitivity state, and a pixel signal for high illuminance is obtained from the unit pixel 131 (D2).

Figure 14:
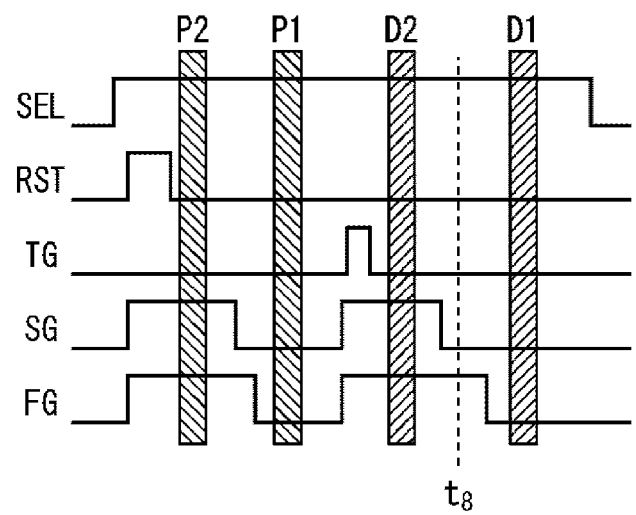
FIG. 14 is a view for explaining an example of a driving state.
Figure 14:
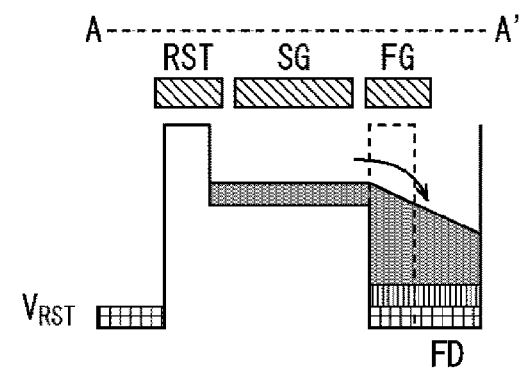
Figure 14:
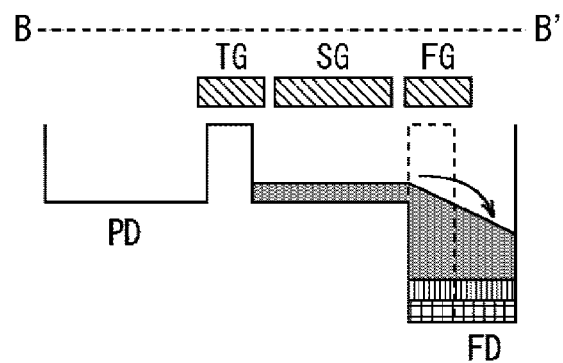

At a time $t_8$ in A of FIG. 14, the SG 151 is turned off. At the time, the potential distribution of the section between A and A' in FIG. 4 is as illustrated in B of FIG. 14, and the potential distribution between B and B' in FIG. 4 is as illustrated in C of FIG. 14. That is, the charge is completely transferred from the SG 151 to the floating diffusion 182.

Figure 15:
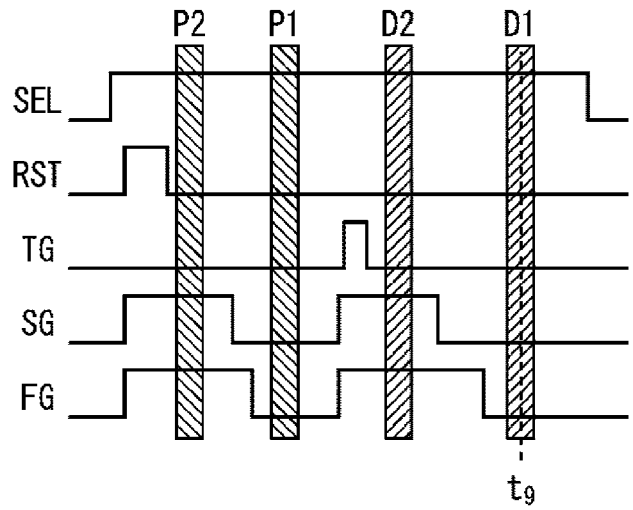
FIG. 15 is a view for explaining an example of a driving state.
Figure 15:
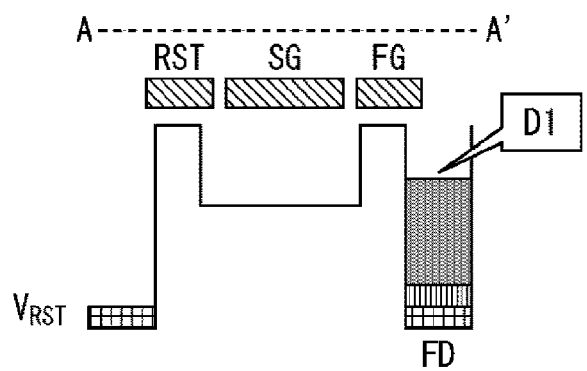
Figure 15:
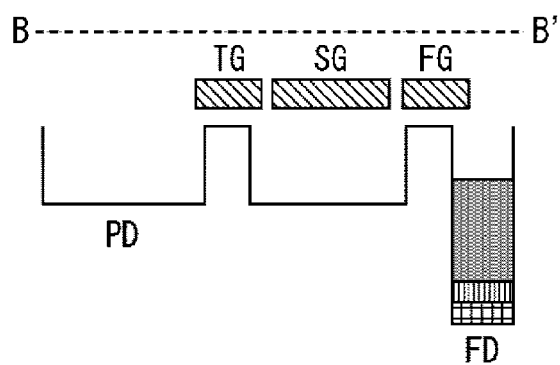

At a time $t_9$ in A of FIG. 15, the FG 152 is turned off, and a second D phase reading is performed. At the time, the potential distribution of the section between A and A' in FIG. 4 is as illustrated in B of FIG. 15, and the potential distribution between B and B' in FIG. 4 is as illustrated in C of FIG. 15. The FG 152 is in the off state. Therefore, this is a state in which the SG 151 and the floating diffusion 182 are separated. Therefore, in this case, only the charge of the floating diffusion 182 is read. At this time, as described with reference to FIG. 14, the charge completely transferred from the SG 151 is also accumulated in the floating diffusion 182, and this charge is also read. That is, the D phase reading is performed in a high sensitivity state, and a pixel signal for low illuminance is obtained from the unit pixel 131 (D1).

As described above, since it is possible to read both a low illuminance signal and a high illuminance signal without resetting the signals for one charge accumulation period of the photodiode 141, the image sensor 100 can obtain a pixel signal with a high dynamic range. In addition, since both the low illuminance signal and the high illuminance signal can be obtained in one charge accumulation period (that is, short term), it is possible to suppress the occurrence of blur of the subject when obtaining the pixel signal with the high dynamic range. This arrangement makes it possible to suppress the occurrence of an error during signal combining.

In addition, since correlated double sampling (CDS) can be performed as a reading operation as described above, a thermal noise can be suppressed not only for the low illuminance signal but also for the high illuminance signal. Therefore, S/N can be improved. In addition, it is possible to suppress occurrence of a noise step at the boundary between the low illuminance signal and the high illuminance signal.

3. Second Embodiment

<Shared Pixel>

The configuration of the unit pixel 131 is arbitrary, and is not limited to the example of FIG. 3. For example, the plurality of photodiodes may be provided in the unit pixel, and the plurality of photodiodes may share a floating diffusion or the like. More specifically, the transfer transistor is provided in each photodiode, and the configuration of the other unit pixel including the floating diffusion is shared. Hereinafter, the unit pixel having a structure in which a plurality of photodiodes share a floating diffusion or the like is also referred to as a shared pixel.

Figure 16:
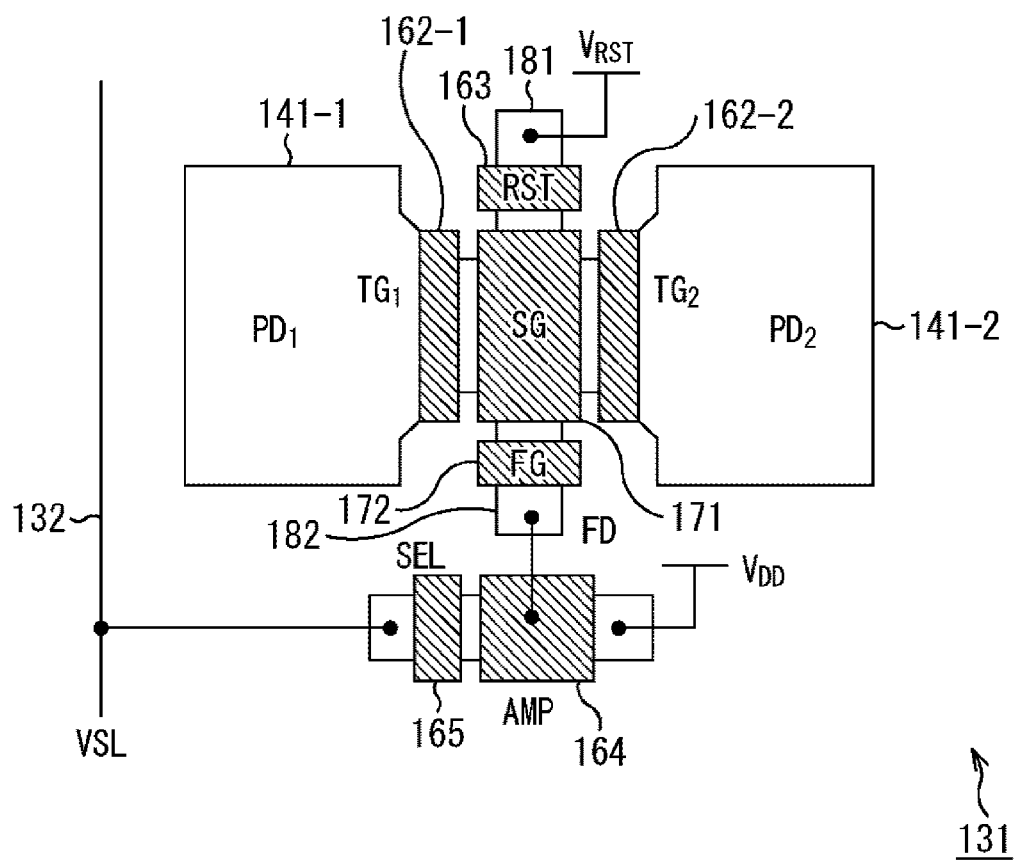
FIG. 16 is a plan view illustrating a main configuration example of a shared pixel.

FIG. 16 is a plan view illustrating a main configuration example of the unit pixel 131 in a case where the floating diffusion 182 is shared by two photodiodes 141. As illustrated in FIG. 16, the unit pixel 131 in this case has two photodiodes 141 (a photodiode 141-1 and a photodiode 141-2). Each photodiode 141 is connected to the SG 151 via each of the transfer transistors 142. That is, the photodiode 141-1 ($PD_1$) is connected to the SG 151 via the transfer transistor 142-1 ($TG_1$), the photodiode 141-2 ($PD_2$) is connected to the SG 151 via the transfer transistor 142-2 ($TG_2$). As illustrated in FIG. 16, the gate 162-1 of the transfer transistor 142-1 and the gate 162-2 of the transfer transistor 142-2 are arranged near the gate 171 of the SG 151. That is, the transfer transistor 142-1 and the transfer transistor 142-2 are arranged adjacent to the SG 151.

Figure 17:
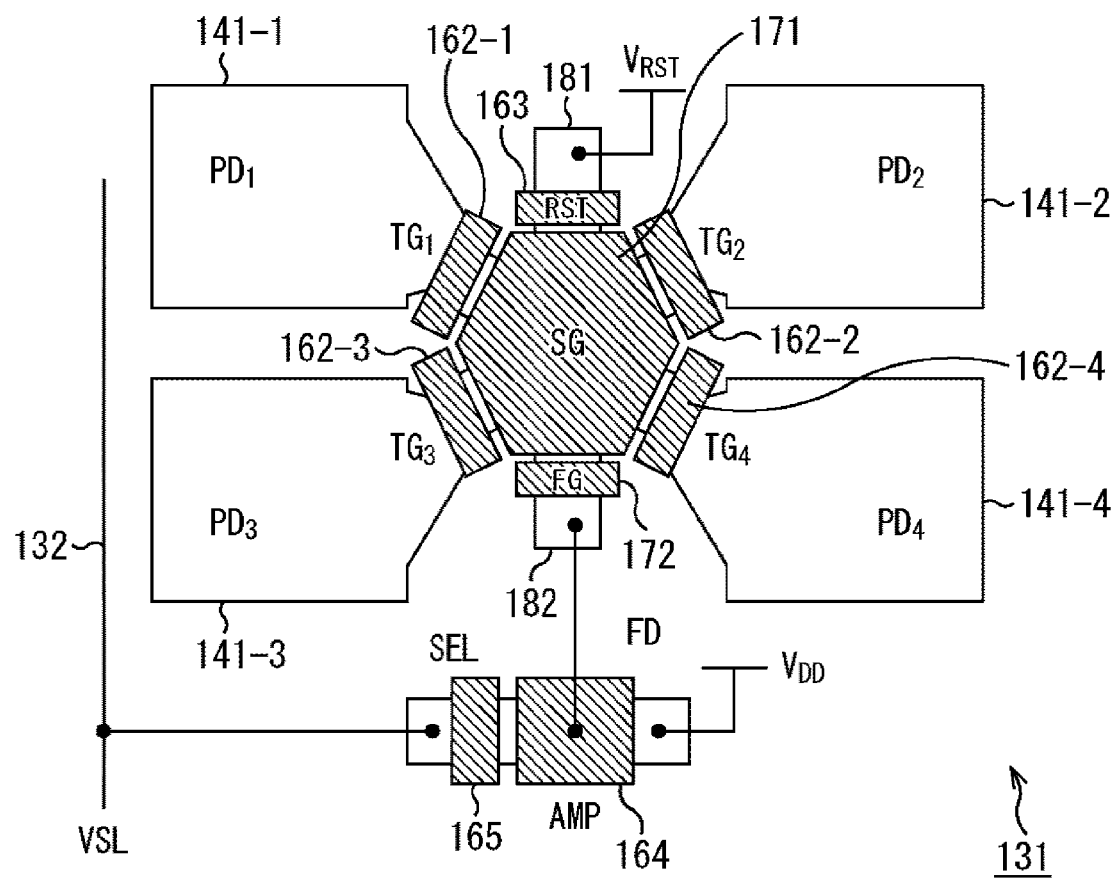
FIG. 17 is a plan view illustrating a main configuration example of a shared pixel.

FIG. 17 is a plan view illustrating a main configuration example of the unit pixel 131 in a case where the floating diffusion 182 is shared by four photodiodes 141. As illustrated in FIG. 17, the unit pixel 131 in this case has four photodiodes 141 (photodiode 141-1 to photodiode 141-4). Each photodiode 141 is connected to the SG 151 via each of the transfer transistors 142. That is, the photodiode 141-1 ($PD_1$) is connected to the SG 151 via the transfer transistor 142-1 ($TG_1$), the photodiode 141-2 ($PD_2$) is connected to the SG 151 via the transfer transistor 142-2 ($TG_2$), the photodiode 141-3 ($PD_3$) is connected to the SG 151 via the transfer transistor 142-3 ($TG_3$), and the photodiode 141-4 ($PD_4$) is connected to the SG 151 via the transfer transistor 142-4 ($TG_4$). As illustrated in FIG. 17, the gate 162-1 of the transfer transistor 142-1, the gate 162-2 of the transfer transistor 142-2, the gate 162-3 of the transfer transistor 142-3, and the gate 162-4 of the transfer transistor 142-4 are arranged near the gate 171 of the SG 151. That is, the transfer transistors 142-1 to 142-4 are arranged adjacent to the SG 151.

Figure 18:
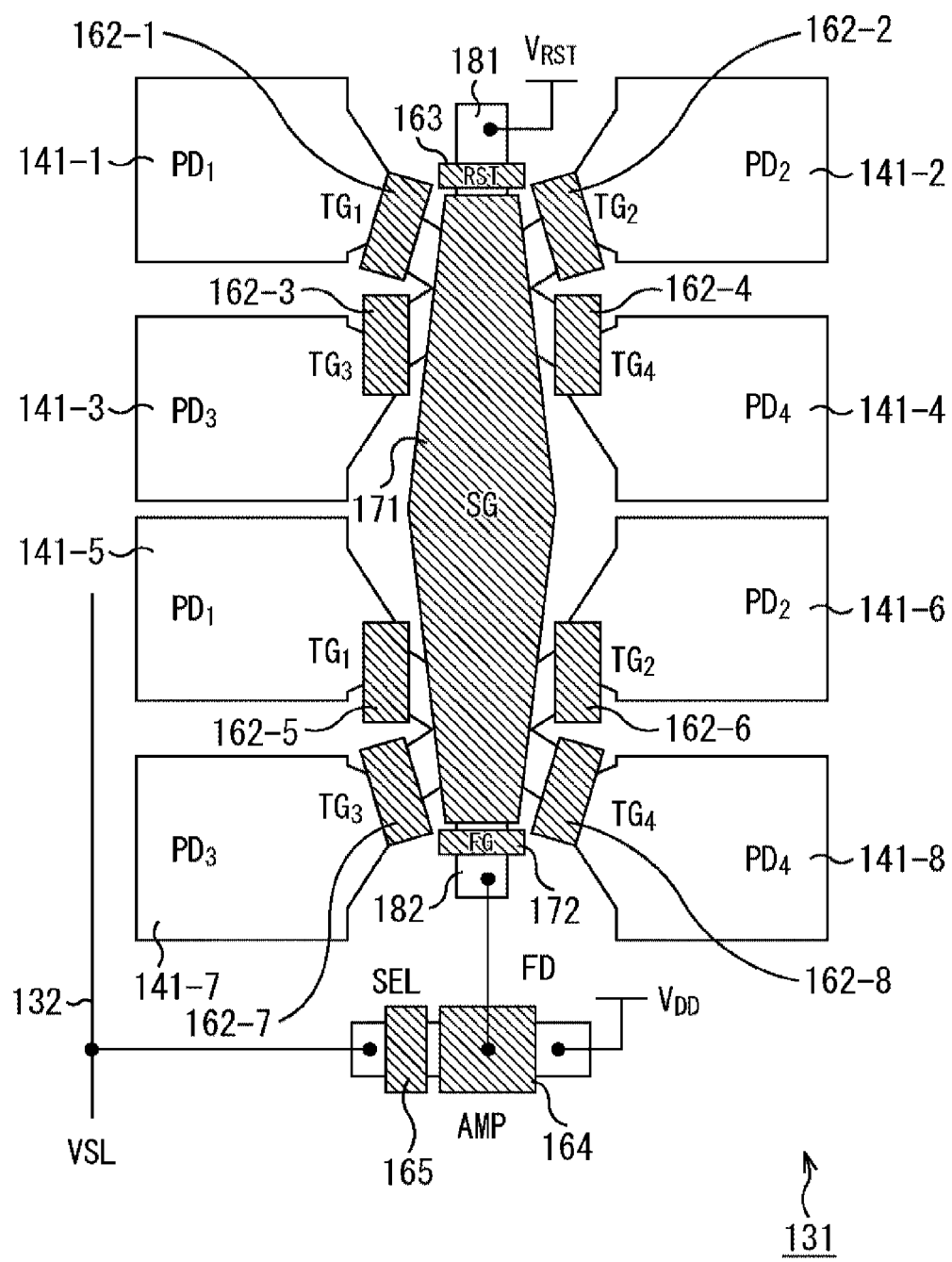
FIG. 18 is a plan view illustrating a main configuration example of a shared pixel.

FIG. 18 is a plan view illustrating a main configuration example of the unit pixel 131 in a case where the floating diffusion 182 is shared by eight photodiodes 141. As illustrated in FIG. 18, the unit pixel 131 in this case has eight photodiodes 141 (photodiode 141-1 to photodiode 141-8). Each photodiode 141 is connected to the SG 151 via each of the transfer transistors 142. That is, the photodiode 141-1 ($PD_1$) is connected to the SG 151 via the transfer transistor 142-1 ($TG_1$), the photodiode 141-2 ($PD_2$) is connected to the SG 151 via the transfer transistor 142-2 ($TG_2$), the photodiode 141-3 ($PD_3$) is connected to the SG 151 via the transfer transistor 142-3 ($TG_3$), the photodiode 141-4 ($PD_4$) is connected to the SG 151 via the transfer transistor 142-4 ($TG_4$), the photodiode 141-5 ($PD_1$) is connected to the SG 151 via the transfer transistor 142-5 ($TG_1$), the photodiode 141-6 ($PD_2$) is connected to the SG 151 via the transfer transistor 142-6 ($TG_2$), the photodiode 141-7 ($PD_3$) is connected to the SG 151 via the transfer transistor 142-7 ($TG_3$), and the photodiode 141-8 ($PD_4$) is connected to the SG 151 via the transfer transistor 142-8 ($TG_4$). As illustrated in FIG. 18, the gate 162-1 of the transfer transistor 142-1, the gate 162-2 of the transfer transistor 142-2, the gate 162-3 of the transfer transistor 142-3, the gate 162-4 of the transfer transistor 142-4, the gate 162-5 of the transfer transistor 142-5, the gate 162-6 of the transfer transistor 142-6, the gate 162-7 of the transfer transistor 142-7 and the gate 162-8 of the transfer transistor 142-8 are arranged near the gate 171 of the SG 151. That is, the transfer transistor 142-1 to the transfer transistor 142-8 are arranged adjacent to the SG 151.

As described above, when the plurality of photodiodes 141 share the floating diffusion 182 or the like, each photodiode 141 is connected to the floating diffusion 182 via the SG 151 and the FG 152. Therefore, even if the number of photodiodes 141 is increased, the parasitic capacitance on the floating diffusion 182 does not change. Therefore, it is possible to realize sharing of the floating diffusion while suppressing reduction of the charge-voltage conversion sensitivity.

Note that a plurality of SGs 151 and FGs 152 may be used. As in the case of FIG. 18, the unit pixel 131 illustrated in FIG. 19 shares the floating diffusion 182 with eight photodiodes 141. However, in this case, the plurality of (SG1, SG2, and SG3) SGs 151 are provided. Also, the plurality of FGs 152 (FG1, FG2, and FG3) are provided. In this case, as illustrated in FIG. 19, between the reset voltage $V_{RST}$ and the floating diffusion 182, the gate 163 of the reset transistor 143, a gate 171-1 of SG 151-1 (SG1), a gate 172-1 of the FG 152-1 (FG1), a gate 171-2 of the SG151-2 (SG2), a gate 172-2 of the FG 152-2 (FG2), a gate 171-3 of the SG 151-3 (SG3), and a gate 172-3 of the FG 152-3 (FG3) are provided.

The photodiode 141-1 ($PD_1$) is connected to the SG 151-1 (SG1) via the transfer transistor 142-1 ($TG_1$), the photodiode 141-2 ($PD_2$) is connected to the SG 151-1 (SG1) via the transfer transistor 142-2 ($TG_2$), the photodiode 141-3 ($PD_3$) is connected to the SG 151-1 (SG1) via the transfer transistor 142-3 ($TG_3$), and the photodiode 141-4 ($PD_4$) is connected to the SG 151-1 (SG1) via the transfer transistor 142-4 ($TG_4$). Further, the photodiode 141-5 ($PD_1$) is connected to the SG 151-3 (SG3) via the transfer transistor 142-5 ($TG_1$), the photodiode 141-6 ($PD_2$) is connected to the SG 151-3 (SG3) via the transfer transistor 142-6 ($TG_2$), the photodiode 141-7 ($PD_3$) is connected to the SG 151-3 (SG3) via the transfer transistor 142-7 ($TG_3$), and the photodiode 141-8 ($PD_4$) is connected to the SG 151-3 (SG3) via the transfer transistor 142-8 ($TG_4$).

Figure 19:
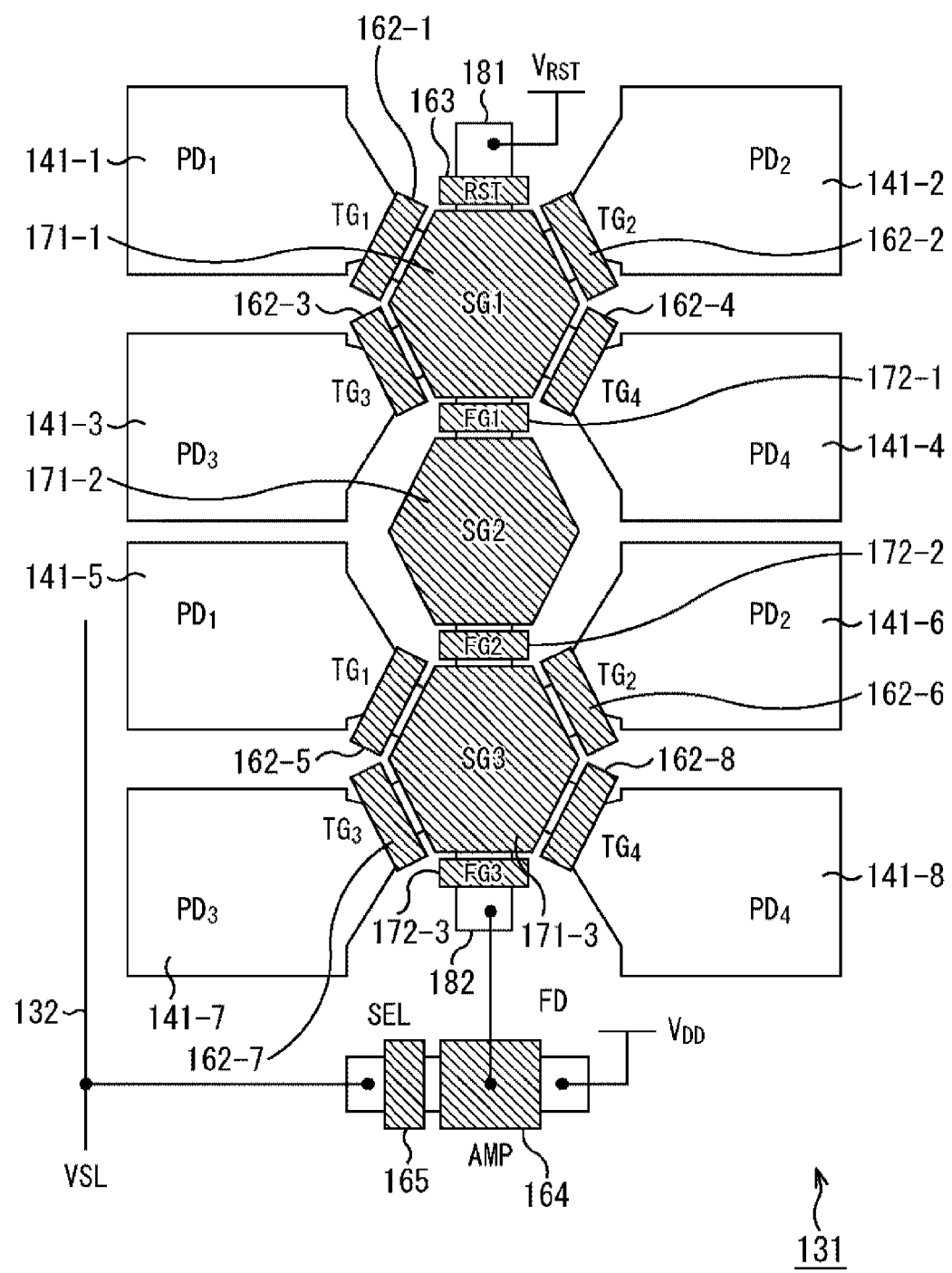
FIG. 19 is a plan view illustrating a main configuration example of a shared pixel.

That is, in the case of FIG. 19, the gate 162-1 to the gate 162-4 are arranged near the gate 171-1 of the SG 151-1, and the gate 162-5 to the gate 162-8 are arranged near the gate 171-3. That is, in the case of FIG. 19, the transfer transistor 142-1 to the transfer transistor 142-4 are arranged adjacent to the SG 151-1 and the transfer transistor 142-5 to the transfer transistor 142-8 are arranged adjacent to the SG 151-3.

Also in such a case, a complete charge transfer can be realized by adjusting the driving timing of each SG 151 and each FG 152.

A configuration in which the floating diffusions are shared by the eight photodiodes is arbitrary, and is not limited to the above example. For example, two photodiodes sharing a floating diffusion by the four photodiodes illustrated in FIG. 17 may be used to share the floating diffusions by eight photodiodes. An example is illustrated in FIG. 20.

Figure 20:
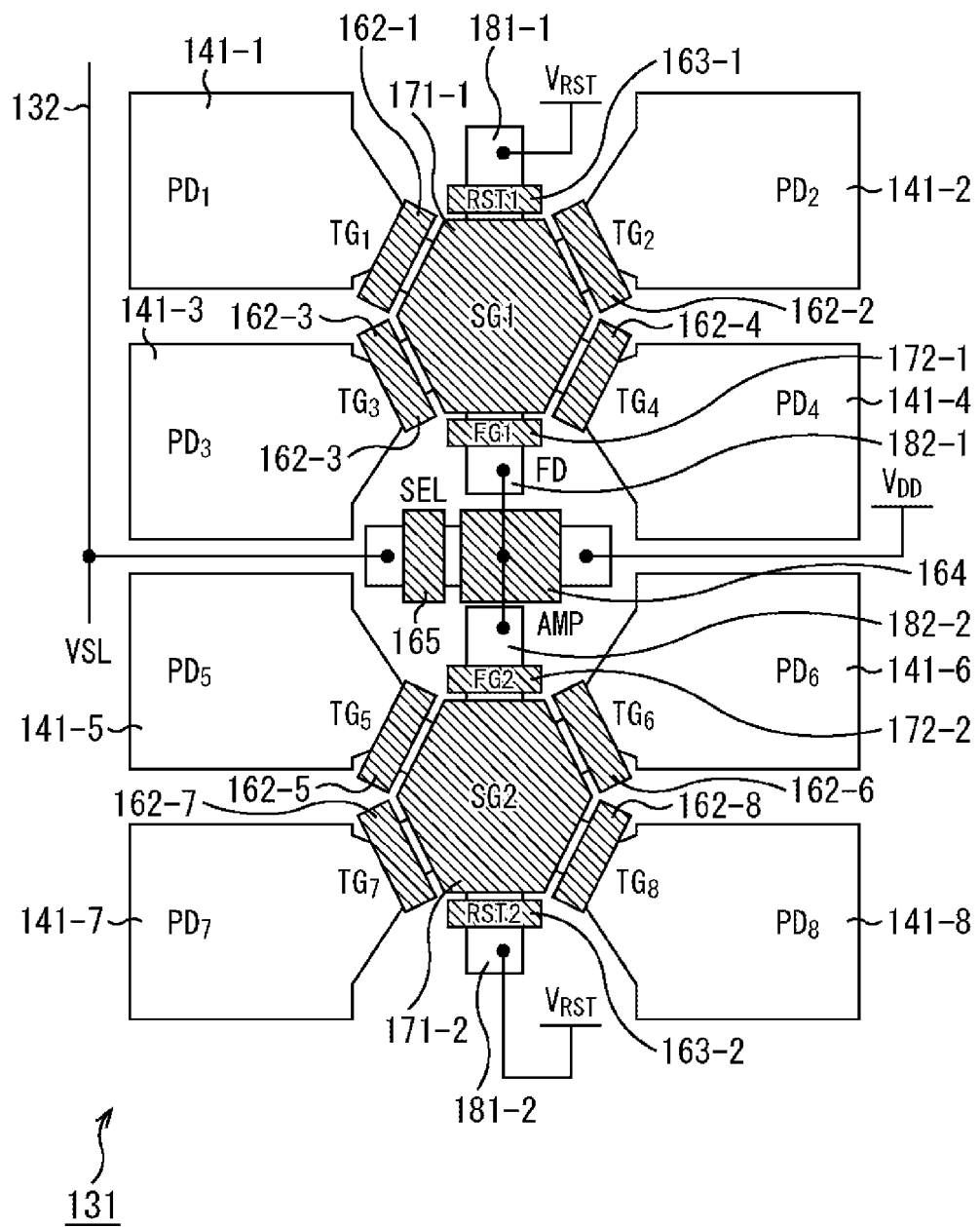
FIG. 20 is a plan view illustrating a main configuration example of a shared pixel.

In the configuration example of FIG. 20, the floating diffusions 182 (floating diffusion 182-1, floating diffusion 182-2) are provided at the position of SG 151-2 (SG2) in FIG. 19. That is, two sets of four photodiodes 141 and the like as illustrated in FIG. 17 are connected to one amplification transistor 144 (AMP) (and selection transistor 145 (SEL)).

That is, the photodiode 141-1 ($PD_1$) is connected to the SG 151-1 (SG1) via the transfer transistor 142-1 ($TG_1$). The photodiode 141-2 ($PD_2$) is connected to the SG 151-1 (SG1) via the transfer transistor 142-2 ($TG_2$). The photodiode 141-3 ($PD_3$) is connected to the SG 151-1 (SG 1) via the transfer transistor 142-3 ($TG_3$). The photodiode 141-4 ($PD_4$) is connected to the SG 151-1 (SG1) via the transfer transistor 142-4 ($TG_4$).

Similarly, the photodiode 141-5 ($PD_5$) is connected to the SG 151-2 (SG2) via the transfer transistor 142-5 ($TG_5$). The photodiode 141-6 ($PD_6$) is connected to the SG 151-2 (SG2) via the transfer transistor 142-6 ($TG_6$). The photodiode 141-7 ($PD_7$) is connected to the SG 151-2 (SG2) via the transfer transistor 142-7 ($TG_7$). The photodiode 141-8 ($PD_8$) is connected to the SG 151-2 (SG2) via the transfer transistor 142-8 ($TG_8$).

In FIG. 20, the gate 162-1 indicates the gate of the transfer transistor 142-1 ($TG_1$). The gate 162-2 indicates the gate of the transfer transistor 142-2 ($TG_2$). The gate 162-3 indicates the gate of the transfer transistor 142-3 ($TG_3$). The gate 162-4 indicates the gate of the transfer transistor 142-4 ($TG_4$). The gate 162-5 indicates the gate of the transfer transistor 142-5 ($TG_5$). The gate 162-6 indicates the gate of the transfer transistor 142-6 ($TG_6$). The gate 162-7 indicates the gate of the transfer transistor 142-7 ($TG_7$). The gate 162-8 indicates the gate of the transfer transistor 142-8 ($TG_8$). Further, the gate 171-1 indicates the gate of the SG 151-1 (SG1). The gate 171-2 indicates the gate of the SG 151-2 (SG2).

Two reset voltages $V_{RST}$ are provided, one of which is connected to the SG 151-1 (SG1) via the reset transistor 143-1 (RST1) and the other is connected to the SG 151-2 (SG2) via the reset transistor 143-2 (RST2). In FIG. 20, the gate 163-1 indicates the gate of the reset transistor 143-1 (RST1), and the gate 163-2 indicates the gate of the reset transistor 143-2 (RST2).

The SG 151-1 (SG1) is connected to the floating diffusion 182-1 via the FG 152-1 (FG1). That is, the SG 151-1 (SG1) is connected to the amplification transistor 144 (AMP) via the FG 152-1 (FG1) and the floating diffusion 182-1. Similarly, the SG 151-2 (SG2) is connected to the floating diffusion 182-2 via the FG 152-2 (FG2). That is, the SG 151-2 (SG2) is connected to the amplification transistor 144 (AMP) via the FG 152-2 (FG2) and the floating diffusion 182-2.

In FIG. 20, the gate 164 indicates the gate of the amplification transistor 144 (AMP), and the gate 165 indicates the gate of the selection transistor 145 (SEL).

Therefore, in the case of FIG. 20, the gate 162-1 to the gate 162-4 are arranged near the gate 171-1 of the SG 151-1 (SG1), and the gate 162-5 to the gate 162-8 are arranged near the gate 171-2 of the SG 151-2 (SG2). That is, in the case of FIG. 20, the transfer transistor 142-1 to the transfer transistor 142-4 ($TG_1$ to $TG_4$) are arranged adjacent to the SG 151-1 (SG1) and the transfer transistor 142-5 to the transfer transistor 142-8 ($TG_5$ to $TG_8$) are arranged adjacent to the SG 151-2 (SG2).

As described above, the photodiodes 141-1 to 141-4 ($PD_1$ to $PD_4$) and the reset voltage $V_{RST}$ are connected to the floating diffusion 182-1 via the SG 151-1 and the FG 152-1. Similarly, the photodiodes 141-5 to 14-8 ($PD_5$ to $PD_8$) and the reset voltage $V_{RST}$ are connected to the floating diffusion 182-2 via the SG 151-2 and FG 152-2.

In the case of the pixel circuit configuration using common four transistors not sharing a floating diffusion, three transistors that are a transfer transistor, a reset transistor, and an amplification transistor are connected to the floating diffusion. In the pixel circuit configuration using such four transistors, if the number of photodiodes and transfer transistors is increased to eight so that the eight photodiodes share the floating diffusion, a total of ten transistors that are eight transfer transistors, reset transistors, and amplification transistors are connected to the floating diffusion. Therefore, the sensitivity may be reduced.

On the other hand, by adopting the configuration as illustrated in the example of FIG. 20, in spite of the circuit configuration sharing one floating diffusion 182 by the eight photodiodes 141, the transistors connected to the floating diffusion 182 can be three of FG 152-1 (FG1), FG 152-2 (FG2), and amplification transistor 144 (AMP). Therefore, an increase in the parasitic capacitance on the floating diffusion 182 can be suppressed. Therefore, it is possible to realize sharing of the floating diffusion while suppressing reduction of the charge-voltage conversion sensitivity. Also in such a case, a complete charge transfer can be realized by adjusting the driving timing of each SG 151 and each FG 152.

In the case of the example of FIG. 19, two transistors that are FG 152-3 (FG 3) and amplification transistor 144 (AMP) are connected to the floating diffusion 182, so that reduction in sensitivity can be further suppressed.

As described above, also in the case of a structure in which the floating diffusions 182 and the like are shared by the plurality of photodiodes 141, similarly to the example described with reference to FIG. 15, the FG 152 may be turned off to read the signal from the unit pixel 131. For example, in the case of FIG. 20, the FG 152-1 (FG1) and the FG 152-2 (FG2) are turned off, and a signal is read from the unit pixel 131. Therefore, in this case, only the charge of the floating diffusion 182 is read. That is, in the example of FIG. 20 described above, signals corresponding to the charge of the floating diffusion 182-1 and the floating diffusion 182-2 are output to the vertical signal line 132 (VSL). With this configuration, it is possible to perform reading with high sensitivity. That is, the pixel signal for low illuminance is obtained from the unit pixel 131.

Further, similarly to the example described with reference to FIG. 13, the SG 151 and the FG 152 may be turned on to read the signal from the unit pixel 131. For example, in the case of FIG. 20, the SG 151-1 (SG1) and the SG 151-2 (SG2), and the FG 152-1 (FG1) and FG 152-2 (FG2) are turned off and a signal is read from the unit pixel 131. In this case, the SG 151, the FG 152, and the floating diffusion 182 are connected to each other (the potentials are the same), and the charge of the SG 151, the FG 152, and the floating diffusion 182 are read. That is, in the example of FIG. 20 described above, signals corresponding to the charge of SG 151-1 (SG1), SG 151-2 (SG2), FG 152-1 (FG1), FG 152-2 (FG2), floating diffusion 182-1 and floating diffusion 182-2 are output to the vertical signal line 132 (VSL). With this configuration, it is possible to perform reading in a low sensitivity state. That is, a high illuminance pixel signal is obtained from the unit pixel 131.

In other words, also in the case of a structure in which floating diffusions and the like are shared by a plurality of photodiodes, by turning on or off the SG 151 and the FG 152, it is possible to obtain a low illuminance pixel signal from the unit pixel 131 or to obtain a high illuminance pixel signal.

When reading is performed in this manner, the number of photodiodes from which charge are read may be one or more. For example, in the case of FIG. 20, one of charges of the photodiodes 141-1 to the photodiodes 141-8 (PD$_1$ to PD$_8$) can be read in a highly sensitive state or can be read in a low sensitivity state. Furthermore, for example, two of more charges of the photodiodes 141-1 to the photodiodes 141-8 (PD$_1$ to PD$_8$) can be read in a highly sensitive state or can be read in a low sensitivity state.

Needless to say, it is not limited to the example of FIG. 20, and similarly in the example of FIGS. 16 to 19, it is possible to obtain a pixel signal for low illuminance from the unit pixel 131, and obtain a pixel signal for high illuminance from the unit pixel 131.

For example, in the case of the example of FIG. 19, SG 151 and FG 152 are smaller by one than in the case of FIG. 20, and the channel capacity can be reduced by that amount, so that it is possible to read the charge in a lower sensitivity state. Further, the saturation charge amount can be increased.

Further, in the case of the configuration example of FIG. 19, the FG 152-3 (FG3) is turned off, and the charge of the floating diffusion 182 can be read. Further, the FG 152-3 (FG3) and the SG 151-3 (SG3) are turned on, the FG 152-2 (FG2) is turned off, and the charge of the floating diffusions 182, the FG 152-3 (FG3) and the SG 151-3 (SG3) can be read. Further, the FG 152-3 (FG3), the SG 151-3 (SG3), the FG 152-2 (FG2), and the SG 151-2 (SG2) are turned on, the FG 152-1 (FG1) is turned off, and the charge of the floating diffusions 182, the FG 152-3 (FG3), the SG 151-3 (SG3), the FG 152-2 (FG2), and the SG 151-2 (SG2) can be read. Further, the FG 152-3 (FG3), the SG 151-3 (SG3), the FG 152-2 (FG2), the SG 151-2 (SG2), the FG 152-1 (FG1), and SG 151-1 (SG1) are turned off, and the charge of the floating diffusions 182, the FG 152-3 (FG3), the SG 151-3 (SG3), the FG 152-2 (FG2), SG 151-2 (SG2), FG152-1 (FG1), and the SG 151-1 (SG1) can be read. That is, it is possible to read charge with sensitivity of four levels.

On the other hand, in the case of the example of FIG. 20, it is possible to read the charge of the floating diffusion 182 with the FG 152-1 (FG1) and FG 152-2 (FG2) being turned off. Furthermore, the charge of the floating diffusion 182, FG 152-1 (FG1), and SG 151-1 (SG1) can be read with the FG 152-1 (FG1) and SG 151-1 (SG1) being turned on and the FG 152-2 (FG2) being turned off (FG 152-2 (FG2) and SG 151-2 (SG2) may be turned on and FG 152-1 (FG1) may be turned off). Further, the FG 152-1 (FG1), the SG 151-1 (SG1), the FG 152-2 (FG2), and the SG 151-2 (SG2) are turned on, and the charge of the floating diffusions 182, the FG 152-1 (FG3), the SG 151-1 (SG1), the FG 152-2 (FG2), and the SG 151-2 (SG2) can be read. That is, it is possible to read charge with sensitivity of three levels.

In the configuration example of FIG. 20, the floating diffusion 182-1 and the floating diffusion 182-2 are integrated (one floating diffusion 182), and the floating diffusions 182 may be shared by the photodiodes 141-1 to 141-8 (PD$_1$ to PD$_8$). In that case, the positions of the amplification transistor 144 (AMP) and the selection transistor 145 (SEL) are arbitrary.

Figure 21:
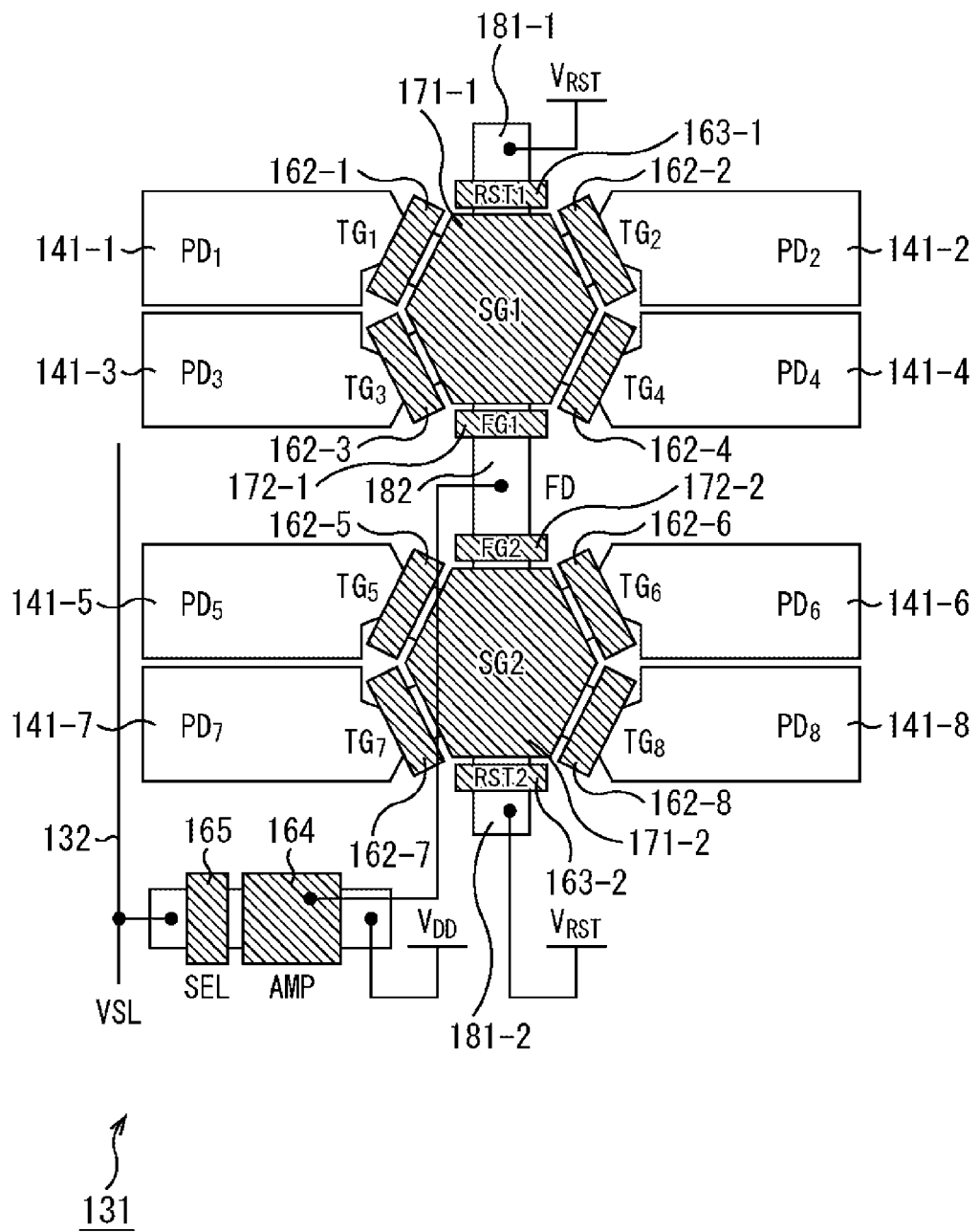
FIG. 21 is a plan view illustrating a main configuration example of a shared pixel.

For example, as illustrated in FIG. 21, the amplification transistor 144 (AMP) and the selection transistor 145 (SEL) may be arranged outside the group of the photodiodes 141 (the photodiode 141-1 to the photodiode 141-8 (PD$_1$ to PD$_8$)). In the example of FIG. 21, the amplification transistor 144 (AMP) and the selection transistor 145 (SEL) are arranged on the lower side of the photodiodes 141-7 (PD$_7$) in FIG. 21. Furthermore, for example, the amplification transistor 144 (AMP) and the selection transistor 145 (SEL) may be arranged on the lower side of the photodiode 141-8 (PD$_8$) in FIG. 21. Furthermore, for example, the amplification transistor 144 (AMP) and the selection transistor 145 (SEL) are arranged at the lower side of the photodiode 141-3 (PD$_3$) in FIG. 21 (the upper side of the photodiode 141-5 (PD$_5$) in FIG. 21), or at the lower side of the photodiode 141-4 (PD$_4$) in FIG. 21 (the upper side of the photodiode 141-6 (PD$_6$) in FIG. 21. Further, for example, the amplification transistor 144 (AMP) and the selection transistor 145 (SEL) may be arranged on the upper side of the photodiode 141-1 (PD$_1$) or the photodiode 141-2 (PD$_2$) in FIG. 21. Further, for example, the amplification transistor 144 (AMP) and the selection transistor 145 (SEL) are arranged on the left side of the photodiode 141 group (the photodiode 141-1 to the photodiode 141-8 (PD$_1$ to PD$_8$)) in FIG. 21 or on the right side thereof in FIG. 21.

Figure 22:
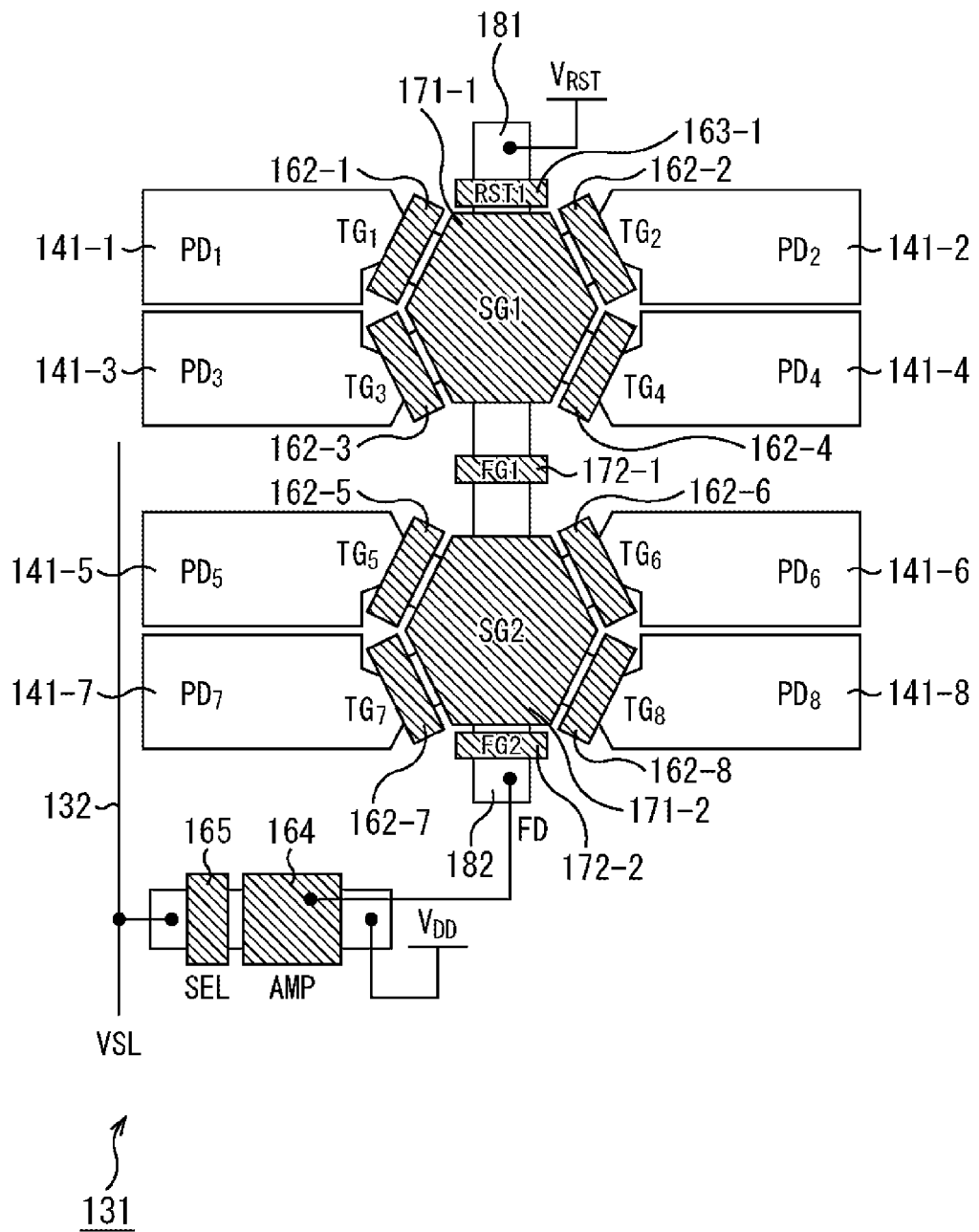
FIG. 22 is a plan view illustrating a main configuration example of a shared pixel.

In a case where the amplification transistor 144 (AMP) and the selection transistor 145 (SEL) are arranged on the lower side of the photodiodes 141-7 (PD$_7$) in FIG. 21 as illustrated in FIG. 21, the lower side of the SG 151-2 (SG2) in FIG. 21 may be set as the floating diffusion 182 as illustrated in FIG. 22. That is, the FG 152-2 (FG2) is arranged on the lower side of the SG 151-2 in FIG. 22. In this case, as illustrated in FIG. 22, the gate 172-2 of the FG 152-2 (FG2) is arranged on the lower side of the gate 171-2 of the SG 151-2 (SG2) in FIG. 22. In other words, the SG 151-2 (SG2) and the FG 152-2 (FG2) can be omitted from the configuration example of FIG. 19.

4. Third Embodiment

<Pixel Content Amount>

Figure 23:
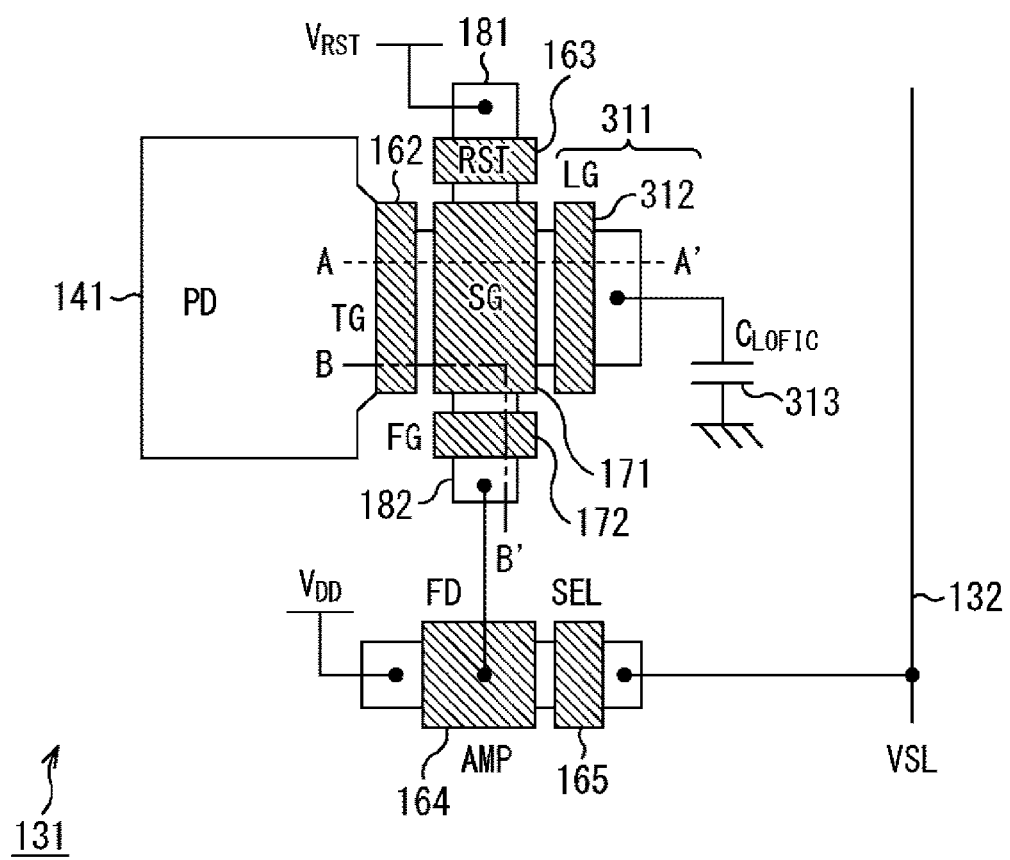
FIG. 23 is a plan view illustrating a main configuration example of the unit pixel.

In addition, a capacitor may be arranged in the unit pixel 131, and the charge overflowing from the photodiode 141 may be overflowed and accumulated. A main configuration example of the plane of the unit pixel 131 in that case is illustrated in FIG. 23. As illustrated in FIG. 23, a LG 311 is connected to the side opposite to the side where the transfer transistor 142 of the SG 151 is connected. A capacitor 313 is connected to the LG 311.

The LG 311 is a node that controls the connection between the SG 151 and the capacitor 313. As illustrated in FIG. 23, the gate 312 of the LG 311 is arranged near the gate 171 of the SG 151, and the LG 311 is adjacent to the SG 151. One side of the capacitors 313 is connected to the LG 311 and the other side of the capacitor 313 is grounded.

Figure 24:
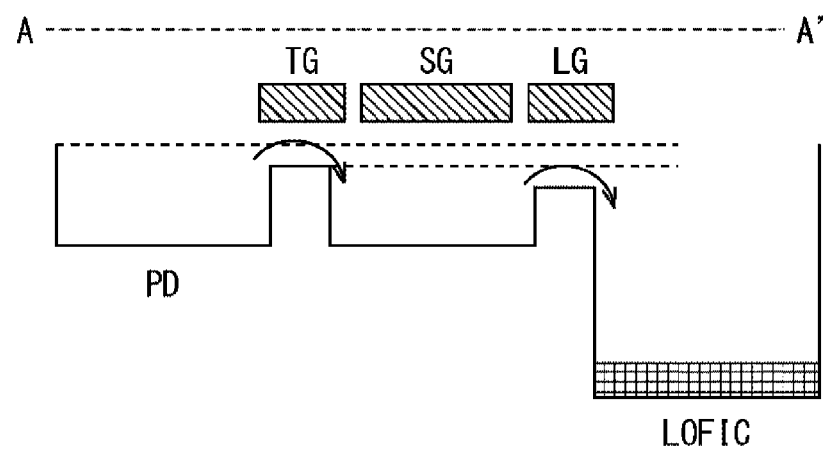
FIG. 24 is a view for explaining an example of a driving state.
Figure 24:
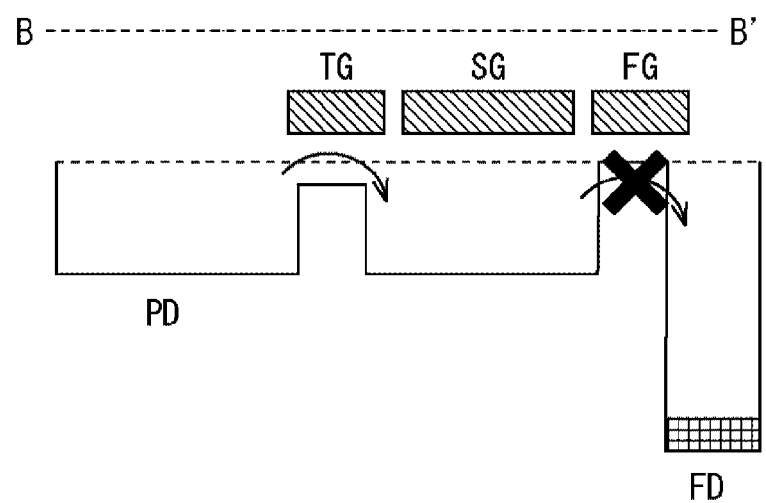

A of FIG. 24 illustrates the potential distribution of the section between A and A' in FIG. 23. As illustrated in A of FIG. 24, the charge overflowing from the photodiode 141 is transferred to the capacitor 313 via the SG 151 and accumulated. B of FIG. 24 illustrates the potential distribution of a section between B and B' in FIG. 23. As illustrated in B of FIG. 24, due to the FG 152 being in the off state, charge is not transferred from the SG 151 to the floating diffusion 182.

Accordingly, it is possible to increase a charge amount that can be handled. Note that the LG 311 and the capacitor 313 may be configured to be capable of performing a complete charge transfer. Accordingly, it is possible to suppress an increase in thermal noise on a high illuminance side signal.

5. Fourth Embodiment

<Global Shutter>

Figure 25:
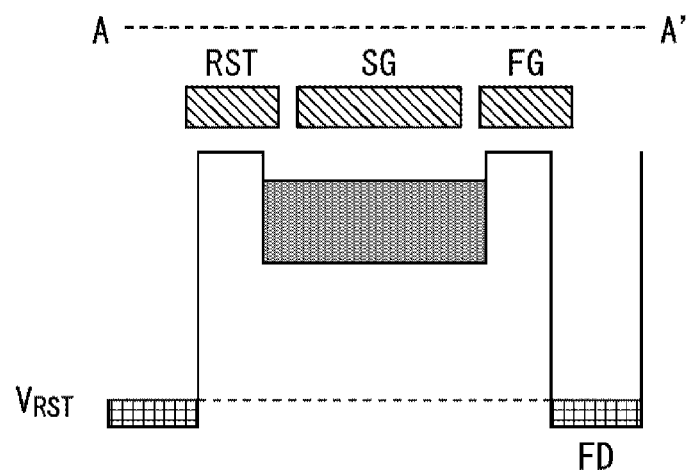
FIG. 25 is a view for explaining an example of a driving state.
Figure 25:
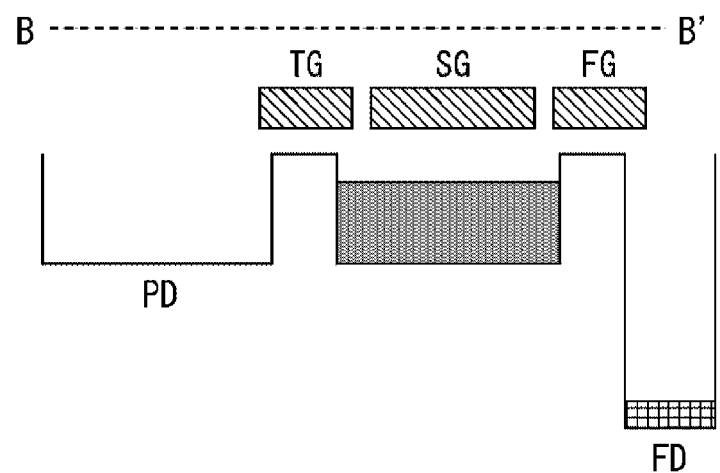

Reading timing of each pixel of the image sensor 100 is arbitrary. For example, all pixels may be simultaneously read (global shutter). A of FIG. 25 illustrates the potential distribution of the section between A and A' in FIG. 4, and B of FIG. 25 illustrates the potential distribution between B and B' in FIG. 4. For example, in the unit pixel 131 having the configuration described in the first embodiment, all the pixels are simultaneously transferred to the SG151 as illustrated in A of FIG. 25 and B of FIG. 25. Accordingly, the global shutter can be realized.

In this case, since the floating diffusion 182 cannot be reset before the P phase, the floating diffusion 182 is reset prior to transfer, a potential of the floating diffusion 182 when it is left until P phase reading is taken as P phase, and a D phase signal is superimposed on that potential. Accordingly, the correlated double sampling operation becomes possible. In that case, it is more desirable that the floating diffusion 182 and the SG 151 have lower leakage.

Note that the configuration of the unit pixel 131 is arbitrary, and may not be the configuration described in the first embodiment. For example, as described in the second embodiment, the plurality of photodiodes 141 may be provided in the unit pixel 131, and the plurality of photodiodes 141 may share the floating diffusion 182 or the like. Further, for example, as described in the third embodiment, the capacitor may be provided in the unit pixel 131.

6. Fifth Embodiment

<SG Division>

Figure 26:
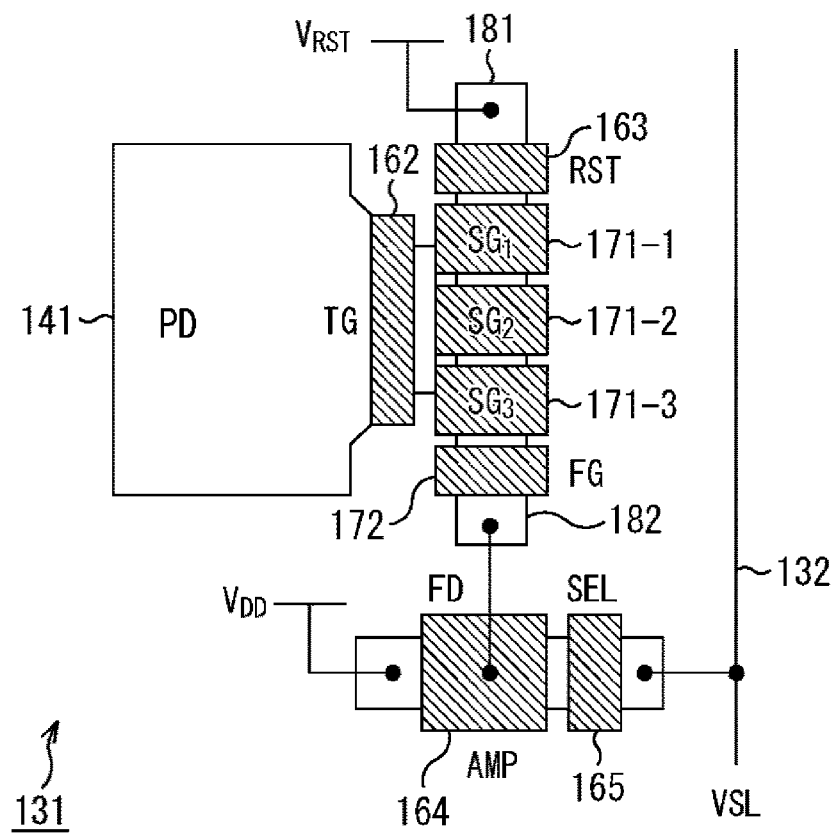
FIG. 26 is a plan view illustrating a main configuration example of the unit pixel.

A plurality of SGs 151 may be provided. For example, as illustrated in FIG. 26, the gate 171 of the SG 151 of the configuration described in the first embodiment (FIG. 3 and the like) may be divided into a plurality of gates. In FIG. 26, the gate 171 is divided into three of a gate 171-1, a gate 171-2, and a gate 171-3. The transfer transistor 142 is connected to all three SGs 151. Of course, the transfer transistor 142 may be connected to only a part of the SG 151.

As described above, by preparing the plurality of SGs 151 and by adjusting the driving timing of each SG 151, it is possible to adjust the conversion efficiency or improve the transfer efficiency.

7. Sixth Embodiment

<Source Grounding>

As described above, the description is made so that the amplification transistor 144 is a source follower (that is, the reading circuit for reading the voltage of the floating diffusion 182 is a drain grounded circuit); however, the amplification transistor 144 may be a source-grounded circuit. In other words, the reading circuit for reading the voltage of the floating diffusion 182 may be a source-grounded circuit connected to the floating diffusion 182. Further, the reading circuit may further perform reading by the source follower.

8. Seventh Embodiment

<SG>

Figure 27:
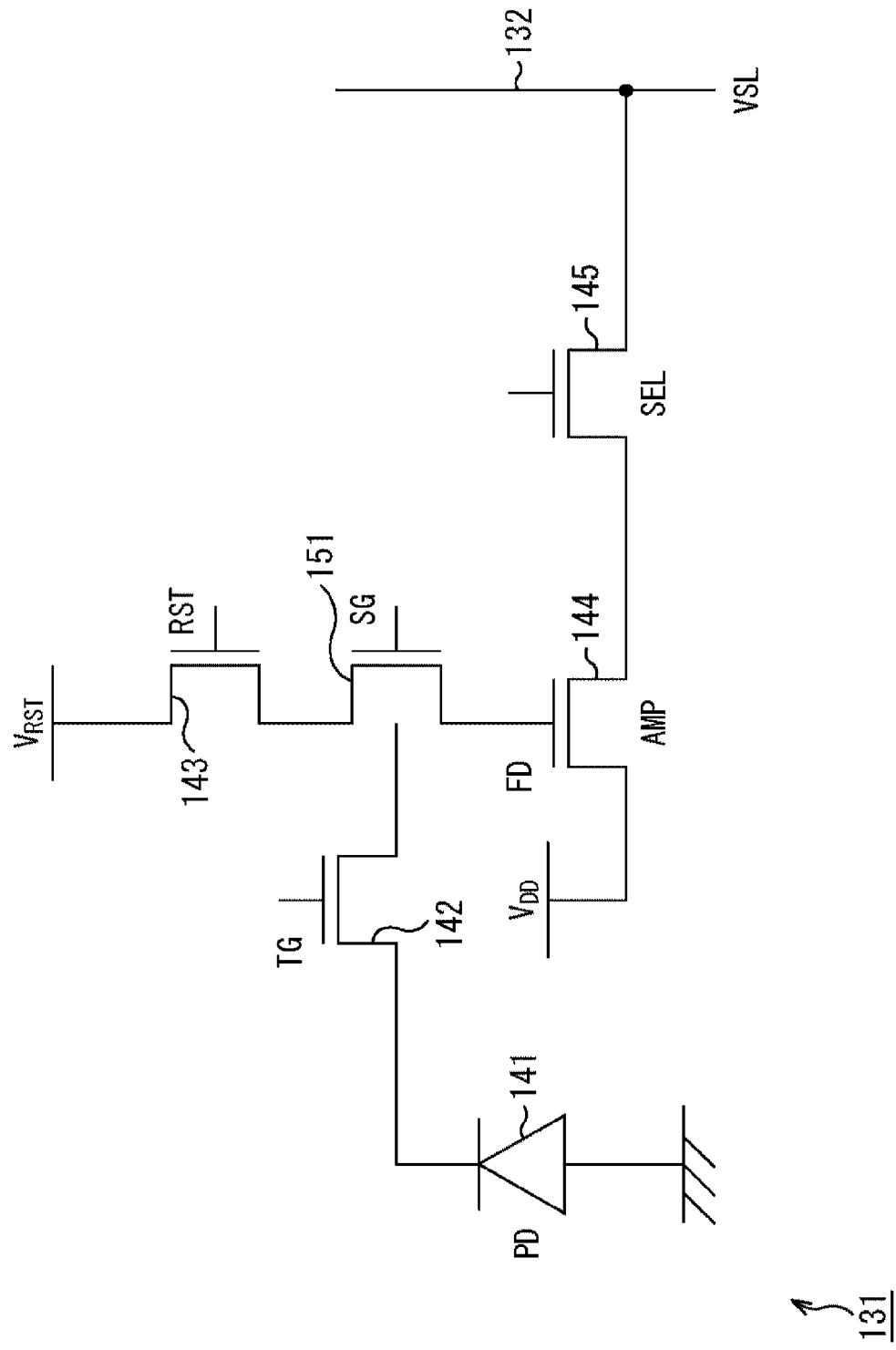
FIG. 27 is a circuit diagram illustrating a main configuration example of a unit pixel.
Figure 28:
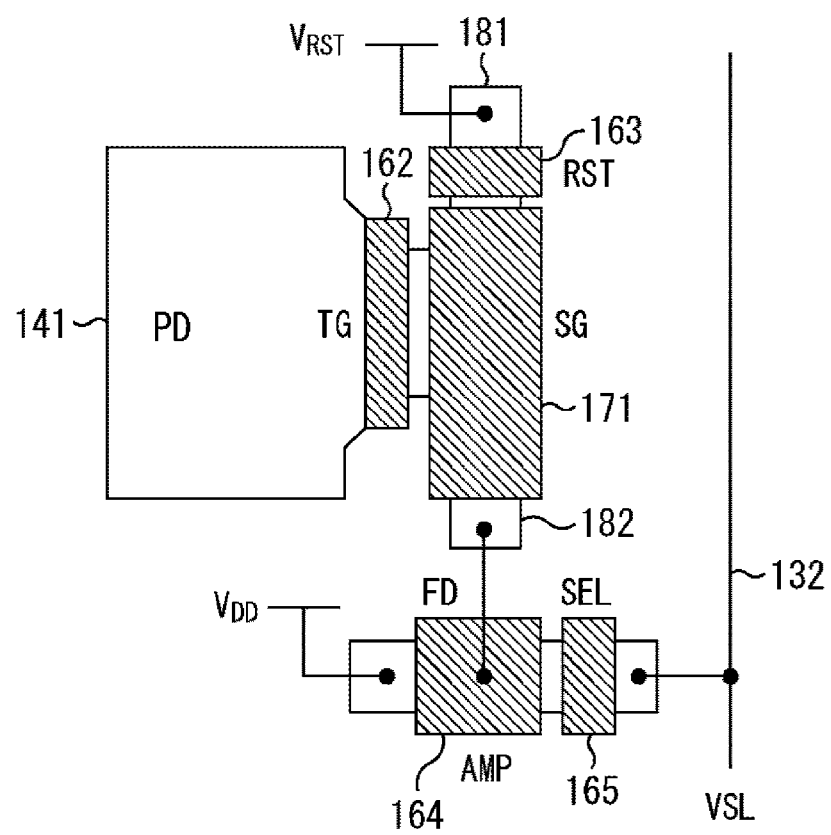
FIG. 28 is a plan view illustrating a main configuration example of the unit pixel.

The FG 152 may be omitted. FIG. 27 is a plan view illustrating a main configuration example of the unit pixel 131. The circuit configuration of the unit pixel 131 illustrated in FIG. 27 is basically the same as the circuit configuration (FIG. 4) described in the first embodiment, but the FG 152 is omitted. That is, the SG 151 is connected to the gate (floating diffusion 182) of the amplification transistor 144. FIG. 28 illustrates a plan configuration of the unit pixel 131 in this case. In this case, as illustrated in FIG. 28, the gate 163 of the reset transistor 143 and the gate 171 of the SG 151 are arranged side by side between the drain 181 of the reset transistor 143 and the floating diffusion 182.

Also in this case, as in the case of the first embodiment, since it is possible to separate the reset transistor 143 (the gate 163) and the floating diffusion 182 (FD), it is possible to reduce the parasitic capacitance on the floating diffusion 182. With this arrangement, charge-voltage conversion sensitivity can be improved.

Figure 29:
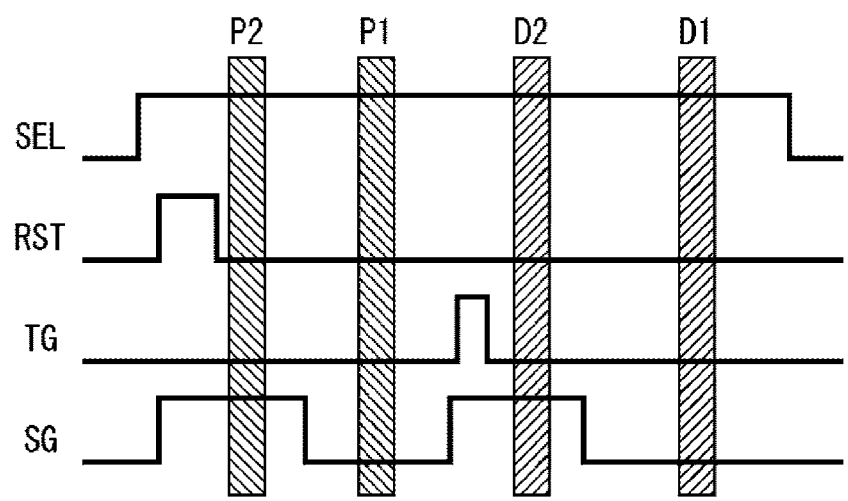
FIG. 29 is a view explaining an example of a control signal.

A timing chart of each control signal in this case is as illustrated in FIG. 29. As illustrated in FIG. 29, also in this case, as in the case of the first embodiment, correlated double sampling reading can be performed. Also, for one charge accumulation period of the photodiode 141, both the low illuminance signal and the high illuminance signal can be read without being reset.

Note that the configuration of this embodiment can also be applied to the case described in other embodiments. For example, similarly to the case described in the second embodiment, the plurality of photodiodes 141 may be provided in the unit pixel 131, and the plurality of photodiodes 141 may share a floating diffusion or the like. In this case, since each transfer transistor 142 is connected to the SG 151 and is not connected to the floating diffusion 182, even if the number of photodiodes 141 is increased, the parasitic capacitance on the floating diffusion 182 does not change. Therefore, it is possible to realize sharing of the floating diffusion while suppressing reduction of the charge-voltage conversion sensitivity.

9. Eighth Embodiment

<Unit Pixel A/D>

Figure 30:
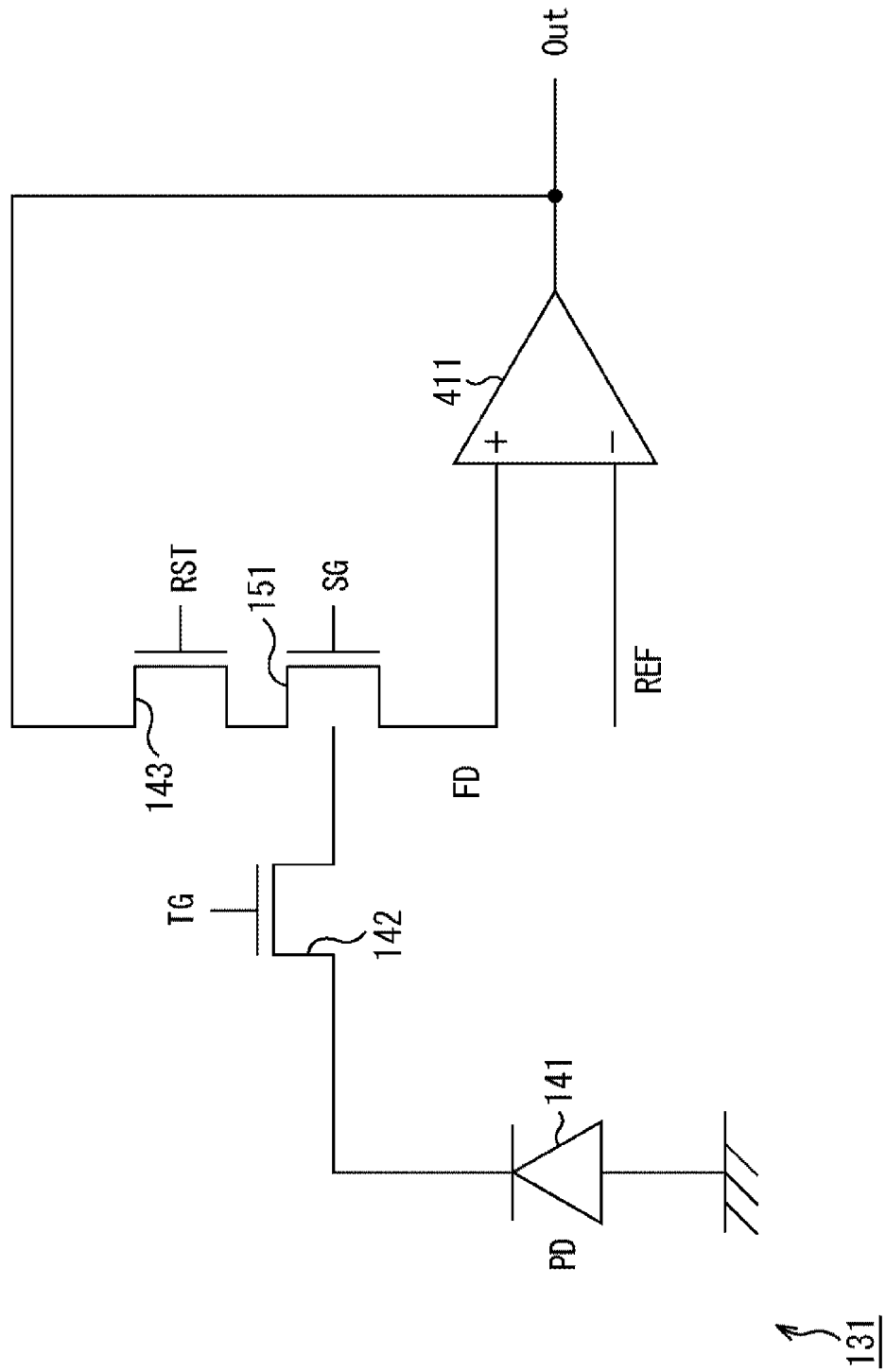
FIG. 30 is a circuit diagram illustrating a main configuration example of a unit pixel and a comparison unit.

An A/D converter that A/D converts a pixel signal may be provided for each unit pixel 131. An example of the main circuit configuration of the unit pixel 131 in that case is as illustrated in FIG. 30. As illustrated in FIG. 30, in this case, the floating diffusion 182 is connected to one input of a comparator 411. A predetermined reference voltage (REF) is supplied to the other input of the comparator 411. The comparator 411 compares the voltage of the floating diffusion 182 with a predetermined reference voltage (REF), and outputs information on the comparison result.

Figure 31:
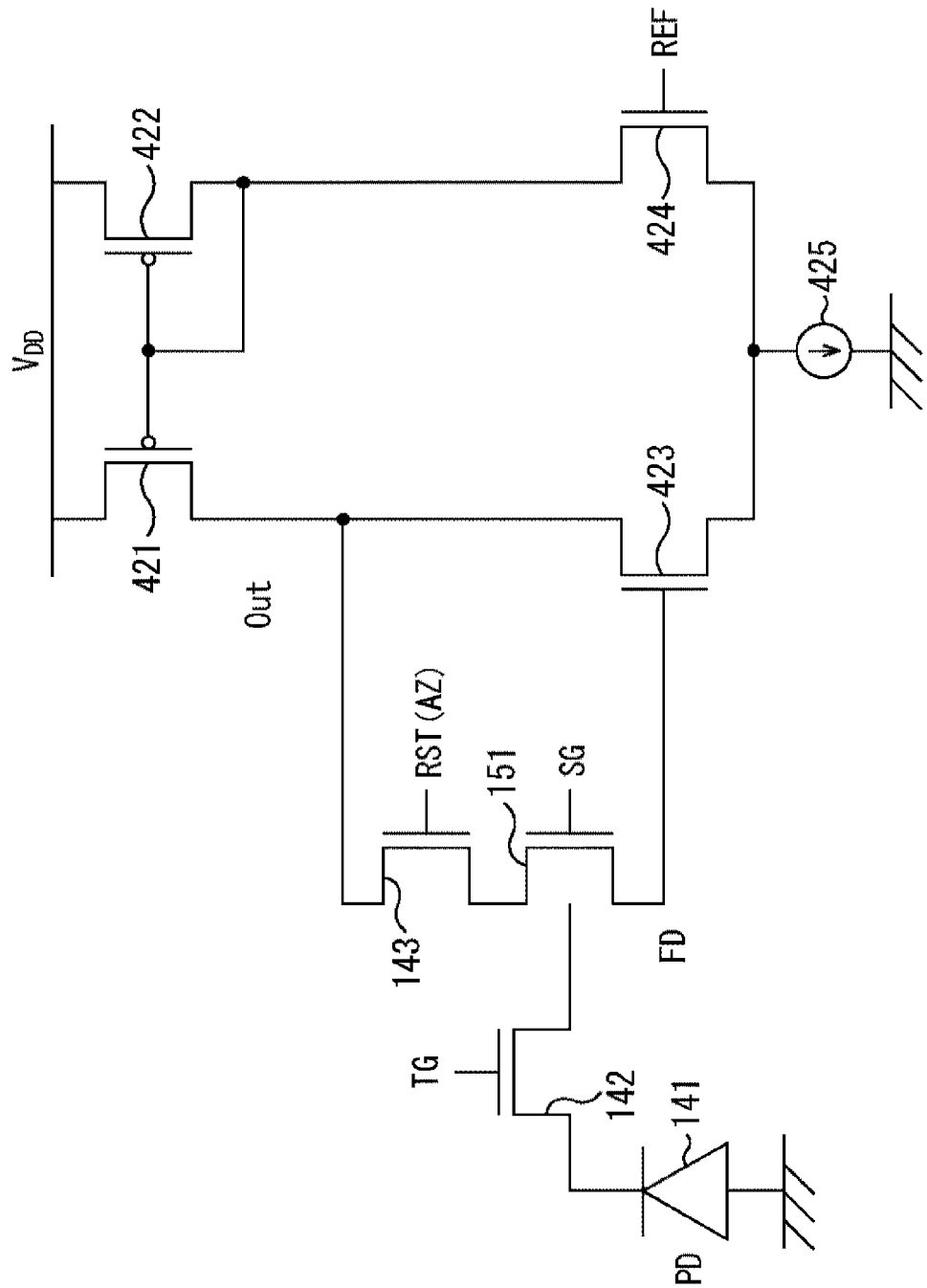
FIG. 31 is a circuit diagram illustrating a main configuration example of a unit pixel and a comparison unit.

FIG. 31 is a diagram illustrating an example of a circuit configuration of the comparator 411. As illustrated in FIG. 31, the comparator 411 includes transistor 421 to transistor 424 and a current source 425.

Accordingly, it is possible to A/D convert the pixel signals of each pixel independently of each other. In addition to this, the A/D converter may be provided for each row, or may be provided for each partial region of the pixel array region 121 (that is, every plural pixels in the same partial region). Further, the A/D converter may be provided for each of a plurality of rows, a plurality of columns, and a plurality of regions, for example. In addition, a plurality of A/D converters may be provided for one unit pixel 131.

10. Ninth Embodiment

<A Plurality of Substrates>

Figure 32:
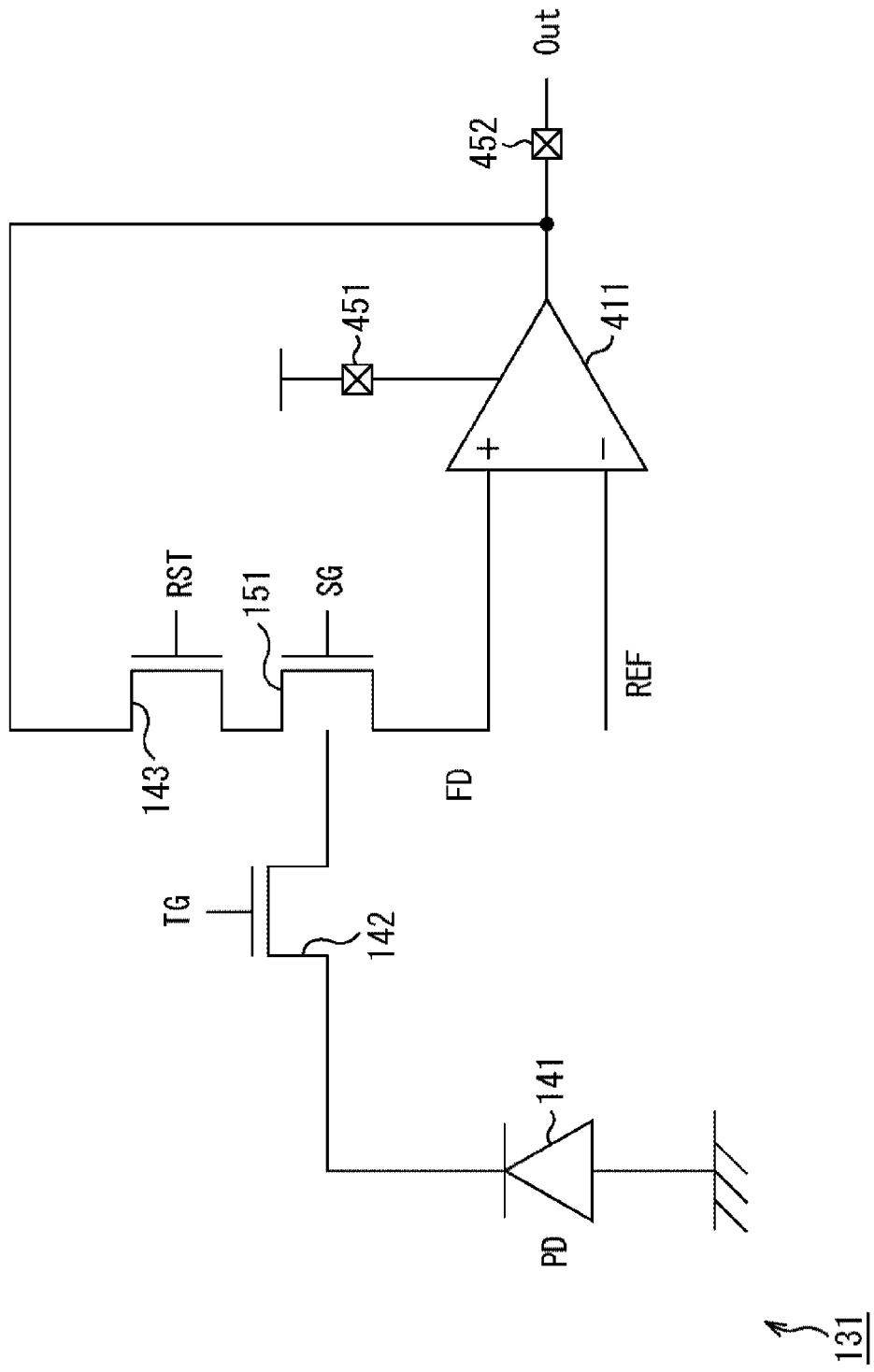
FIG. 32 is a circuit diagram illustrating a main configuration example of a unit pixel and a comparison unit.

As described above, the image sensor 100 may include a plurality of semiconductor substrates. For example, the image sensor 100 may include a plurality of semiconductor substrates stacked on each other. In that case, the circuit configuration described above may be arranged on each semiconductor substrate in any way. An example of the circuit configuration in that case is illustrated in FIG. 32. In the case of FIG. 32, in the configuration (FIGS. 30 and 31) described in the eighth embodiment, a through electrode 451 and a through electrode 452 are provided as illustrated in FIG. 32, and the comparator 411 is connected to the circuit configuration of another semiconductor substrate. That is, the power source portion and the output unit of the comparator 411 are formed on another semiconductor substrate.

Figure 33:
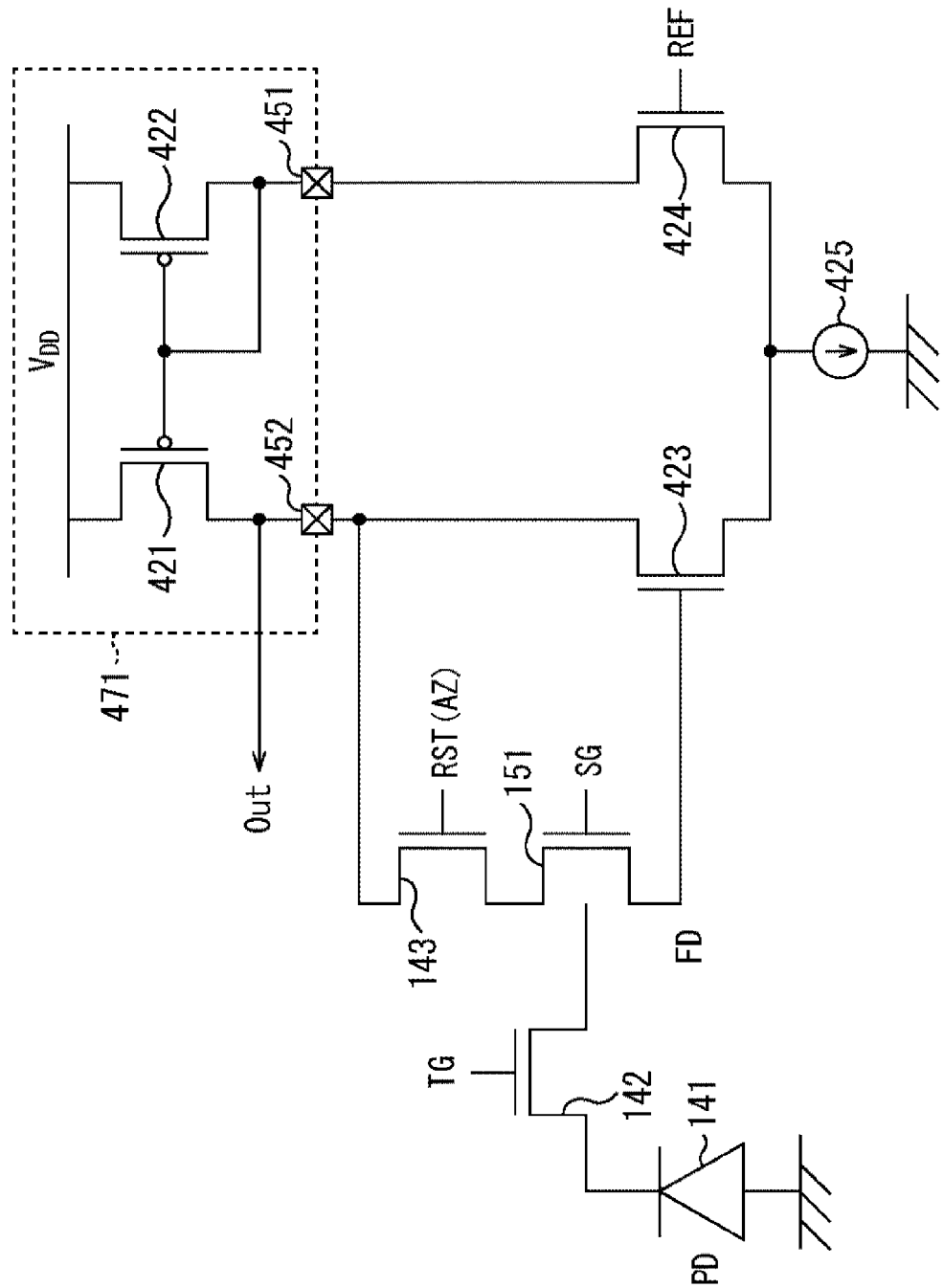
FIG. 33 is a circuit diagram illustrating a main configuration example of a unit pixel and a comparison unit.

FIG. 33 is a diagram illustrating an example of the circuit configuration of the comparator 411 in that case. As illustrated in FIG. 33, in the configuration of the comparator 411, a part of the configuration surrounded by a dotted line frame 471 (configuration relating to power supply and output) is formed on another semiconductor substrate, is connected to the remaining configuration of the comparator 411 formed on the same semiconductor substrate as the photodiode 141 via the through electrode 451 and the through electrode 452.

Accordingly, the circuit configuration formed on one semiconductor substrate can be reduced, so that the circuit and the substrate can be miniaturized. With this arrangement, it is possible to increase the sensitivity by increasing the size of the photodiode 141 and to suppress an increase in cost.

In the above description, the semiconductor substrate is taken as an example of the circuit board to which the present technology is applied, but the present technology is not limited thereto, and the present technology is also applicable to a circuit board other than the semiconductor substrate such as a printed board.

11. Tenth Embodiment

<Imaging Device>

Figure 34:
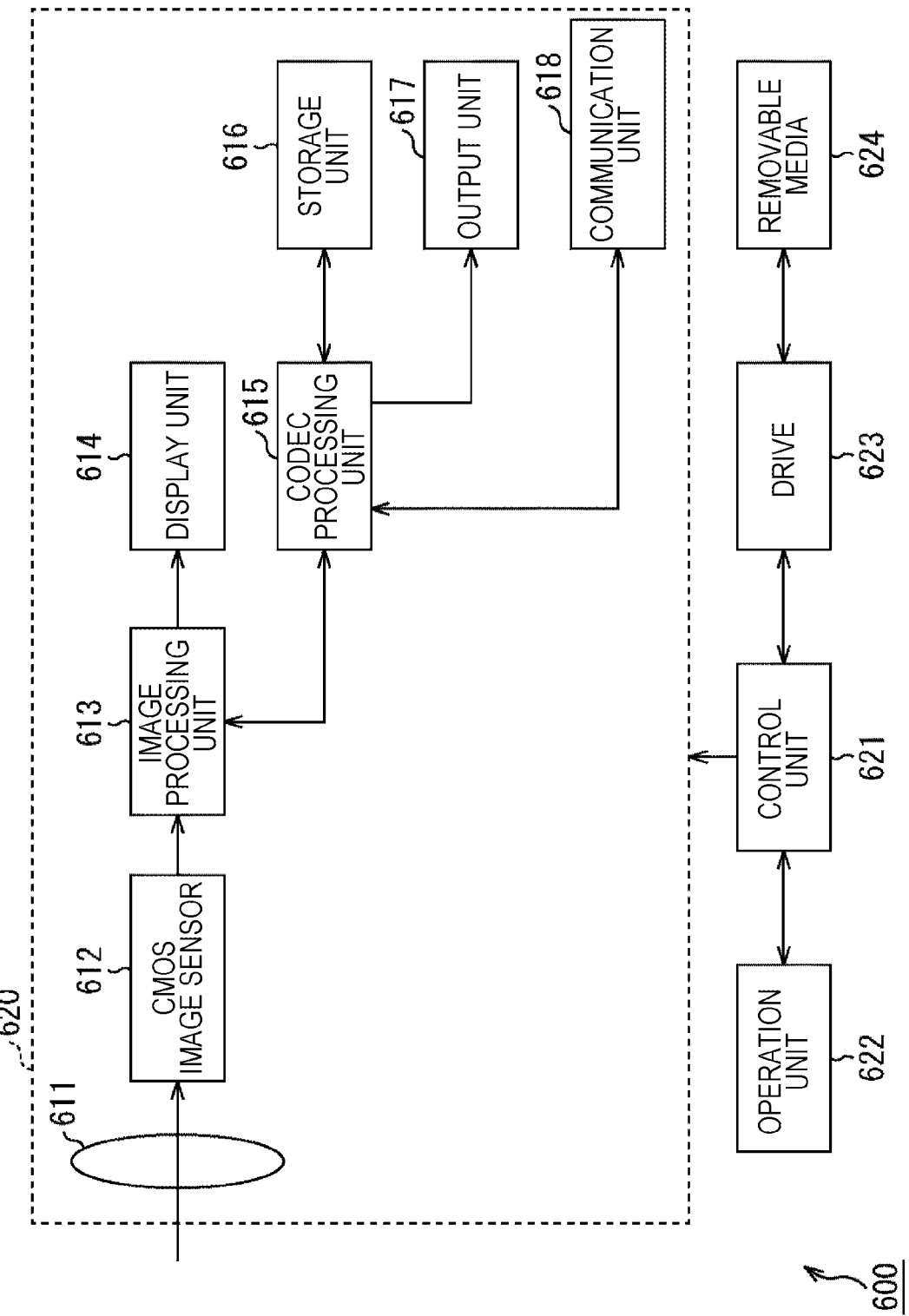
FIG. 34 is a diagram illustrating a main configuration example of an imaging device.

Note that the present technology can also be applied to any elements other than the imaging element. For example, the present technology may be applied to a device (electronic device or the like) having an imaging element such as an imaging device. FIG. 34 is a block diagram illustrating a main configuration example of an imaging device as an example of an electronic device to which the present technology is applied. The imaging device 600 illustrated in FIG. 34 is a device that captures a subject and outputs the image of the subject as an electric signal.

As illustrated in FIG. 34, the imaging device 600 includes an optical unit 611, a CMOS image sensor 612, an image processing unit 613, a display unit 614, a codec processing unit 615, a storage unit 616, an output unit 617, a communication unit 618, a control unit 621, an operation unit 622, and a drive 623.

The optical unit 611 includes a lens for adjusting a focal point to the subject and condensing light from a focused position, a diaphragm for adjusting the exposure, a shutter for controlling the imaging timing, and the like. The optical unit 611 transmits light (incident light) from the subject and supplies the light to the CMOS image sensor 612.

The CMOS image sensor 612 subjects incident light to photoelectric conversion, performs A/D conversion on a signal (pixel signal) for each pixel, performs signal processing such as CDS, and supplies the processed captured image data to the image processing unit 613.

The image processing unit 613 performs image processing on the captured image data obtained by the CMOS image sensor 612. More specifically, the image processing unit 613 performs various kinds of image processing such as mixed color correction, black level correction, white balance adjustment, demosaic processing, matrix processing, gamma correction, YC conversion, and the like, on the captured image data supplied from the CMOS image sensor 612. The image processing unit 613 supplies the captured image data subjected to the image processing to the display unit 614.

The display unit 614 is configured as, for example, a liquid crystal display, and displays an image (for example, an image of a subject) of captured image data supplied from the image processing unit 613.

The image processing unit 613 further supplies the captured image data subjected to the image processing to the codec processing unit 615 as necessary.

The codec processing unit 615 subjects the captured image data supplied from the image processing unit 613 to predetermined encoding processing and supplies the obtained encoded data to the storage unit 616. In addition, the codec processing unit 615 reads encoded data recorded in the storage unit 616, decodes the read encoded data to generate decoded image data, and supplies the decoded image data to the image processing unit 613.

The image processing unit 613 performs predetermined image processing on the decoded image data supplied from the codec processing unit 615. The image processing unit 613 supplies the decoded image data subjected to the image processing to the display unit 614. The display unit 614 is configured as a liquid crystal display or the like, for example, and displays an image of the decoded image data supplied from the image processing unit 613.

The codec processing unit 615 may supply the encoded data obtained by encoding the captured image data supplied from the image processing unit 613 or the encoded data of the captured image data read from the storage unit 616 to the output unit 617, to output the encoded data to the outside of the imaging device 600. Also, the codec processing unit 615 may supply the captured image data before encoding or the decoded image data obtained by decoding the encoded data read from the storage unit 616 to the output unit 617, and outputs the decoded image data to the outside of the imaging device 600.

Furthermore, the codec processing unit 615 may transmit the captured image data, the encoded data of the captured image data, or the decoded image data to another device via the communication unit 618. In addition, the codec processing unit 615 may acquire the captured image data and the encoded data of the image data via the communication unit 618. The codec processing unit 615 appropriately performs encoding, decoding, and the like on the captured image data and the encoded data of the image data acquired via the communication unit 618. The codec processing unit 615 may supply the obtained image data or encoded data to the image processing unit 613 as described above, or may output the encoded data to the storage unit 616, the output unit 617, and the communication unit 618.

The storage unit 616 stores encoded data and the like supplied from the codec processing unit 615. The encoded data stored in the storage unit 616 is read to the codec processing unit 615 and decoded as necessary. The captured image data obtained by decoding processing is supplied to the display unit 614, and a captured image corresponding to the captured image data is displayed.

The output unit 617 has an external output interface such as an external output terminal and outputs various data supplied via the codec processing unit 615 to the outside of the imaging apparatus 600 via the external output interface.

The communication unit 618 supplies various information such as image data and encoded data supplied from the codec processing unit 615 to another device that is a communication partner of predetermined communication (wired communication or wireless communication). In addition, the communication unit 618 acquires various information such as image data and encoded data from another device as a communication partner of a predetermined communication (wired communication or wireless communication), and supplies the acquired information to the codec processing unit 615.

The control unit 621 controls the operation of each processing unit (each processing unit, operation unit 622, and drive 623 illustrated in the dotted line 620) of the imaging device 600.

The operation unit 622 is constituted by an arbitrary input device such as a jog dial (trademark), a key, a button, a touch panel, or the like, receives an operation input by a user or the like, and supplies a signal corresponding to the operation input to the control unit 621.

The drive 623 reads information stored in a removable medium 624 such as a magnetic disk, an optical disk, a magneto-optical disk, or a semiconductor memory mounted on the drive 623. The drive 623 reads various information such as programs and data from the removable medium 624, and supplies the read information to the control unit 621. When the writable removable medium 624 is attached to the drive 623, the drive 623 stores various information such as image data and encoded data supplied via the control unit 621 in the removable medium 624.

As the CMOS image sensor 612 of the imaging device 600 as described above, the present technology described in each embodiment is applied. That is, the image sensor 100 described above is used as the CMOS image sensor 612. With this arrangement, the CMOS image sensor 612 can improve charge-voltage conversion sensitivity. Therefore, by capturing the subject, the imaging device 600 can obtain a higher quality image.

12. Others

Embodiments of the present technology are not limited to the above-described embodiments, and various modifications are possible without departing from the gist of the present technology.

Further, the present technology can be implemented as any configuration constituting a device or system, for example, a processor as a system large scale integration (LSI) or the like, a module using a plurality of processors or the like, a unit using a plurality of modules or the like, a set with additional functions added to the unit, or the like (that is, a configuration of a part of the device).

In this specification, a term "system" means a group of a plurality of components (apparatuses, modules (parts), and the like), and does not matter whether all the components are in the same housing or not. Therefore, both of a plurality of devices that are housed in separate housings and are connected via a network, and one device that houses a plurality of modules in one housing are systems.

Furthermore, the configuration described as one device (or one processing unit) in the above may be divided into a plurality of devices (or a plurality of processing units). On the contrary, configurations descried to have a plurality of devices (or a plurality of processing units) in the above may be collectively configured as one device (or one processing unit). Furthermore, configurations other than those described above may be added to the configuration of each device (or each processing unit) described above. Furthermore, if the configuration and operation of the system as a whole are substantially the same, a part of the configuration of a certain device (or a certain processing unit) may be included in the configuration of another device (or another processing unit).

It should be noted that, as long as no contradiction arises, the present technology described in this specification can be independently implemented. Needless to say, it is also possible to implement the present technology by using a plurality of arbitrary techniques in combination. For example, a part or all of the present technology described in any of the embodiments can be implemented in combination with part or all of the present technology described in other embodiments. In addition, some or all of the above-described present techniques can be implemented in combination with other techniques not described above.

Note that the present technology can also take the following configuration.

(1) An imaging device, comprising, a first pixel including, a photoelectric conversion element to convert incident light into electric charge, a first transfer element and a second transfer element to transfer the electric charge, wherein the first transfer element is coupled between the photoelectric conversion element and the second transfer element, a reset element coupled to the second transfer element, a floating diffusion, and an amplification element coupled to the floating diffusion to amplify a voltage of the floating diffusion, wherein the floating diffusion is coupled between the second transfer element the amplification element.

(2) The imaging device of (1), wherein the first transfer element, the second transfer element, and the reset element are transistors.

(3) The imaging device of (2), wherein a gate of the second transfer element includes a plurality of separated gate portions.

(4) The imaging device of (3), wherein a gate of the first transfer element receives a first control signal to control transfer of the electric charge to the second transfer element, and wherein a gate of the second transfer element receives a second control signal to control transfer of electric charge received from the first transfer element to the floating diffusion and to control transfer of a reset signal to the floating diffusion.

(5) The imaging device of (4), further comprising, a third transfer element between the second transfer element and the floating diffusion.

(6) The imaging device of (5), wherein the third transfer element is a transistor, and wherein a gate of the third transfer element receives a third control signal to control transfer of the electric charge received from the second transfer element to the floating diffusion and to control transfer of the reset signal received from the second transfer element to the floating diffusion.

(7) The imaging device of (1), further comprising, a signal line to output a pixel signal of the first pixel, and a selection element coupled between the signal line and the amplification element and to selectively output the pixel signal to the signal line according to a selection signal.

(8) The imaging device of (1), further comprising, one or more second pixels, wherein the one or more second pixels share the reset element, the second transfer element, the floating diffusion, and the amplification element with the first pixel.

(9) The imaging device of (1), further comprising, a capacitance, and a third transfer element coupled between the second transfer element and the capacitance and to transfer an overflow of the electric charge at the second transfer element to the capacitance.

(10) An imaging device comprising, a first pixel including, a first photoelectric conversion element to convert incident light into first electric charge, a first transfer transistor to transfer the first electric charge, a second transfer transistor, wherein the first transfer transistor is located between the first photoelectric conversion element and the second transfer transistor in a plan view, a reset transistor coupled to the second transfer transistor, and a floating diffusion to receive the first electric charge transferred from the second transfer transistor, wherein the second transfer transistor is located between the reset transistor and the floating diffusion in the plan view.

(11) The imaging device of (10), wherein a gate of the first transfer transistor is adjacent to a gate of the second transfer transistor at a first position in the plan view, wherein a gate of the reset transistor is adjacent to the gate of the second transfer transistor at a second position in the plan view, and wherein the first pixel further comprises, a third transfer transistor coupled between the second transfer transistor and the floating diffusion to transfer the first electric charge received from the second transfer transistor to the floating diffusion, wherein a gate of the third transfer transistor is adjacent to the gate of the second transfer transistor at a third position, wherein the third position is between the gate of the second transfer transistor and the floating diffusion.

(12) The imaging device of (10), wherein the first pixel further comprises, an amplification transistor to amplify a signal at the floating diffusion, wherein the floating diffusion is coupled between the second transfer transistor and the amplification transistor.

(13) The imaging device of (11), further comprising, a second pixel including, a second photoelectric conversion element to convert incident light into second electric charge, and a third transfer transistor to transfer the second electric charge, wherein a gate of the third transfer transistor is adjacent to the second transfer transistor at a fourth position in the plan view, and wherein the first pixel and the second pixel share at least the floating diffusion and the second transfer transistor.

(14) The imaging device of (13), further comprising, a third pixel including, a third photoelectric conversion element to convert incident light into third electric charge, and a fourth transfer transistor to transfer the third electric charge, wherein a gate of the fourth transfer transistor is adjacent to the gate of the second transfer transistor at a fifth position in the plan view; and a fourth pixel including, a fourth photoelectric conversion element to convert incident light into fourth electric charge, and a fifth transfer transistor to transfer the fourth electric charge, wherein a gate of the fifth transfer transistor is adjacent to the gate of the second transfer transistor at a sixth position in the plan view.

(15) An imaging device, comprising, at least one pixel including, a photoelectric conversion element to convert incident light into electric charge, a first transfer element and a second transfer element to transfer the electric charge, wherein the first transfer element is coupled between the photoelectric conversion element and the second transfer element, a reset element coupled to the second transfer element, and a floating diffusion, and a driving circuit to drive the at least one pixel.

(16) The imaging device of (15), wherein the driving circuit drives the at least one pixel during a single read period such that high illuminance information and low illuminance information of the at least one pixel is obtained with a single reset operation.

(17) The imaging device of (16), wherein the first transfer element, the second transfer element, and the reset element are transistors, and wherein the single read period includes, a first phase in which an output of the at least one pixel is read while the reset element and the first transfer element are OFF and the second transfer element is ON, wherein the first phase is subsequent to the single reset operation in which the reset element and the second transfer element are ON to reset the floating diffusion with a reset signal, a second phase subsequent to the first phase and in which the output of the at least one pixel is read while the reset element, the first transfer element, and the second transfer element are OFF, a third phase subsequent to the second phase and in which the output of the at least one pixel is read while the reset element and the first transfer element are OFF and the second transfer element is ON, wherein the third phase is subsequent to the first transfer element and the second transfer element being ON to transfer the electric charge from the first transfer element to the floating diffusion through the second transfer element, a fourth phase subsequent to the third phase and in which the output of the at least one pixel is read while the reset element, the first transfer element, and the second transfer element are OFF.

(18) The imaging device according to (16), wherein the single read period includes sequential first, second, third, and fourth phases during which an output of the at least one pixel is read, wherein the first phase and the third phase correspond to reading with high sensitivity, and wherein the second phase and the fourth phase correspond to reading with low sensitivity.

(19) The imaging device of (18), wherein the first phase and the second phase are used to determine noise of the at least one pixel, and wherein the third phase and the fourth phase are used to determine an amount of the electric charge.

(20) An imaging device, comprising, a first pixel including, a photoelectric conversion element, a first transfer element and a second transfer element, wherein the first transfer element is coupled between the photoelectric conversion element and the second transfer element, a reset element coupled to the second transfer element, a floating diffusion, and an amplification element coupled to the floating diffusion, wherein the floating diffusion is coupled between the second transfer element and the amplification element.

(21) An imaging element including a node capable of performing a complete charge transfer, between a reset switch that controls resetting of a charge in a unit pixel and a floating diffusion that converts a charge into a voltage, the node being adjacent to a transfer switch that controls reading of a charge from a photodiode.

(22) The imaging element according to (21), including a plurality of the nodes.

(23) The imaging element according to (21) or (22), including a plurality of the photodiodes and the transfer switches in the unit pixel, in which the node is configured to be adjacent to the plurality of transfer switches.

(24) The imaging element according to (21) to (23), including a switch and a pixel content amount on an opposite side of the transfer switch of the node, in which the switch controls accumulation of a charge overflowing from the photodiode into the pixel content amount.

(25) The imaging element according to (24), in which the pixel content amount has a structure capable of performing a complete charge transfer.

(26) The imaging element according to any one of (21) to (25), further including a switch that controls connection between the node and the floating diffusion.

(27) The imaging element according to (26), in which the switch has a structure capable of performing a complete charge transfer.

(28) The imaging element according to (26) or (27), including a plurality of switches that control connection between the nodes that are mutually different and the floating diffusions that are identical to each other.

(29) The imaging element according to any one of (21) to (28), further including a comparison unit that is connected to the floating diffusion and compares a voltage of the floating diffusion with a predetermined reference voltage.

(30) The imaging element according to (29), in which a part of a configuration of the comparison unit is formed on a semiconductor substrate different from the unit pixel.

(31) The imaging element according to any one of (21) to (30), further including a reading circuit that reads a voltage of the floating diffusion.

(32) The imaging element according to (31), in which the reading circuit reads a voltage of the plurality of floating diffusions.

(33) The imaging element according to (31), in which the reading circuit is a drain-grounded circuit connected to the floating diffusion.

(34) The imaging element according to (31), in which the reading circuit is a source grounded circuit connected to the floating diffusion.

(35) The imaging element according to (34), in which the reading circuit has a circuit configuration that also performs reading by a source follower.

(36) An electronic device including an imaging unit that captures a subject; and an image processing unit that performs image processing on image data obtained by capturing performed by the imaging unit, the imaging unit including a node capable of performing a complete charge transfer, between a reset switch that controls resetting of a charge in a unit pixel and a floating diffusion that converts a charge into a voltage, the node being adjacent to a transfer switch that controls reading of a charge from a photodiode.

REFERENCE SIGNS LIST

100 Image sensor
121 Pixel array region
122 Peripheral circuit region
131 Unit pixel
132 Vertical signal line
141 Photodiode
142 Transfer transistor
143 Reset transistor
144 Amplification transistor
145 Selection transistor
151 SG
152 FG
162 Gate
163 Gate
164 Gate
165 Gate
171 Gate
172 Gate
311 LG
312 Gate
313 Capacitor
411 Comparator
600 Imaging device
612 CMOS image sensor

The invention claimed is:
1. An imaging device, comprising:
a first pixel including:
a photoelectric conversion element to convert incident light into electric charge;
a first transfer element and a second transfer element to transfer the electric charge, wherein the first transfer element is coupled between the photoelectric conversion element and the second transfer element;
a reset element coupled to the second transfer element;
a floating diffusion;
an amplification element coupled to the floating diffusion to amplify a voltage of the floating diffusion, wherein the floating diffusion is coupled between the second transfer element and the amplification element; and
a third transfer element coupled between the second transfer element and the floating diffusion, wherein the first transfer element, the second transfer element, the third transfer element, and the reset element are transistors, wherein a gate of the first transfer element receives a first control signal to control transfer of the electric charge to the second transfer element, wherein a gate of the second transfer element receives a second control signal to control transfer of electric charge received from the first transfer element to the floating diffusion and to control transfer of a reset signal to the floating diffusion; and wherein a gate of the third transfer element receives a third control signal to control transfer of the electric charge received from the second transfer element to the floating diffusion and to control transfer of the reset signal received from the second transfer element to the floating diffusion.

2. The imaging device of claim 1, wherein the gate of the second transfer element includes a plurality of separated gate portions.

3. The imaging device of claim 1, further comprising:
a signal line to output a pixel signal of the first pixel; and
a selection element coupled between the signal line and the amplification element and to selectively output the pixel signal to the signal line according to a selection signal.

4. The imaging device of claim 1, further comprising:
one or more second pixels, wherein the one or more second pixels share the reset element, the second transfer element, the floating diffusion, and the amplification element with the first pixel.

5. The imaging device of claim 1, further comprising:
a capacitance; and
a fourth transfer element coupled between the second transfer element and the capacitance and to transfer an overflow of the electric charge at the second transfer element to the capacitance.

6. An imaging device comprising:
a first pixel including:
a first photoelectric conversion element disposed in a substrate and that converts incident light into first electric charge;
a floating diffusion disposed in the substrate; and
a transistor layout including:
a first transfer transistor to transfer the first electric charge;
a second transfer transistor, wherein a gate electrode of the first transfer transistor is located on the substrate between the first photoelectric conversion element and a gate electrode of the second transfer transistor on the substrate in a plan view; and
a reset transistor coupled to the second transfer transistor,
wherein the floating diffusion is configured to receive the first electric charge transferred from the second transfer transistor, wherein the gate electrode of the second transfer transistor is located on the substrate between a gate electrode of the reset transistor on the substrate and the floating diffusion in the plan view,
wherein a vertical signal line coupled to the first pixel extends in a first direction, and
wherein the gate electrode of the reset transistor and the gate electrode of the second transfer transistor are offset from one another in the first direction and are at least partially in line with one another in the first direction.

7. The imaging device of claim 6,
wherein the gate electrode of the first transfer transistor and the gate electrode of the second transfer transistor are offset from one another in a second direction perpendicular to the first direction,
wherein the gate electrode of the first transfer transistor is adjacent to the gate electrode of the second transfer transistor at a first position in the plan view,
wherein the gate electrode of the reset transistor is adjacent to the gate electrode of the second transfer transistor at a second position in the plan view, and
wherein the first pixel further comprises:
a third transfer transistor coupled between the second transfer transistor and the floating diffusion to transfer the first electric charge received from the second transfer transistor to the floating diffusion, wherein a gate electrode of the third transfer transistor is adjacent to the gate electrode of the second transfer transistor at a third position, wherein the third position is between the gate electrode of the second transfer transistor and the floating diffusion.

8. The imaging device of claim 7, further comprising:
a second pixel including:
a second photoelectric conversion element to convert incident light into second electric charge; and
a fourth transfer transistor to transfer the second electric charge,
wherein a gate electrode of the fourth transfer transistor is adjacent to the gate electrode of the second transfer transistor at a fourth position in the plan view, and
wherein the first pixel and the second pixel share at least the floating diffusion and the second transfer transistor.

9. The imaging device of claim 8, further comprising:
a third pixel including:
a third photoelectric conversion element to convert incident light into third electric charge; and
a fourth transfer transistor to transfer the third electric charge, wherein a gate electrode of the fourth transfer transistor is adjacent to the gate electrode of the second transfer transistor at a fifth position in the plan view; and
a fourth pixel including:
a fourth photoelectric conversion element to convert incident light into fourth electric charge; and
a fifth transfer transistor to transfer the fourth electric charge, wherein a gate electrode of the fifth transfer transistor is adjacent to the gate electrode of the second transfer transistor at a sixth position in the plan view.

10. The imaging device of claim 6, wherein the first pixel further comprises:
an amplification transistor to amplify a signal at the floating diffusion, wherein the floating diffusion is coupled between the gate electrode of the second transfer transistor and a gate electrode of the amplification transistor.

11. An imaging device, comprising:
at least one pixel including:
a photoelectric conversion element to convert incident light into electric charge;
a first transfer element and a second transfer element to transfer the electric charge, wherein the first transfer element is coupled between the photoelectric conversion element and the second transfer element;
a reset element coupled to the second transfer element; and
a floating diffusion; and a driving circuit to drive the at least one pixel,
wherein the driving circuit drives the at least one pixel during a single read period such that high illuminance information and low illuminance information of the at least one pixel is obtained with a single reset operation,
wherein the single read period includes sequential first, second, third, and fourth phases during which an output of the at least one pixel is read,
wherein the first phase and the third phase correspond to reading with low sensitivity, and
wherein the second phase and the fourth phase correspond to reading with high sensitivity.

12. The imaging device of claim 11, wherein the first transfer element, the second transfer element, and the reset element are transistors, and
wherein:
the first phase is a phase in which an output of the at least one pixel is read while the reset element and the first transfer element are OFF and the second transfer element is ON, wherein the first phase is subsequent to the single reset operation in which the reset element and the second transfer element are ON to reset the floating diffusion with a reset signal;
the second phase is a phase in which the output of the at least one pixel is read while the reset element, the first transfer element, and the second transfer element are OFF;
the third phase is a phase in which the output of the at least one pixel is read while the reset element and the first transfer element are OFF and the second transfer element is ON, wherein the third phase is subsequent to the first transfer element and the second transfer element being ON to transfer the electric charge from the first transfer element to the floating diffusion through the second transfer element;
the fourth phase is a phase in which the output of the at least one pixel is read while the reset element, the first transfer element, and the second transfer element are OFF.

13. The imaging device of claim 11, wherein the first phase and the second phase are used to determine noise of the at least one pixel, and
wherein the third phase and the fourth phase are used to determine an amount of the electric charge.

14. An imaging device, comprising:
a first pixel including:
a photoelectric conversion element disposed in a substrate;
a floating diffusion disposed in the substrate; and
a layout including:
a first transfer element and a second transfer element, wherein an electrode of the first transfer element is on the substrate and coupled between the photoelectric conversion element and an electrode of the second transfer element on the substrate in a plan view;
a reset element coupled to the second transfer element;
an amplification element coupled to the floating diffusion, wherein the floating diffusion is coupled between the second transfer element and the amplification element; and
a third transfer element, wherein an electrode of the third transfer element is on the substrate and between the electrode of the second transfer element and an electrode of the amplification element on the substrate in the plan view,
wherein a vertical signal line coupled to the first pixel extends in a first direction, and
wherein an electrode of the reset element and the electrode of the second transfer element are offset from one another in the first direction and are at least partially in line with one another in the first direction.

* * * * *